US010761929B2

(12) United States Patent
Bolkhovitin et al.

(10) Patent No.: US 10,761,929 B2
(45) Date of Patent: Sep. 1, 2020

(54) DATA STORAGE DRIVE REBUILD WITH PARITY GENERATION OFFLOAD USING PEER-TO-PEER DATA TRANSFERS

(71) Applicant: Western Digital Technologies, Inc., San Jose, CA (US)

(72) Inventors: Vladislav Bolkhovitin, San Jose, CA (US); Brian W. O'Krafka, Austin, TX (US); Sanjay Subbarao, Irvine, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 45 days.

(21) Appl. No.: 15/936,327

(22) Filed: Mar. 26, 2018

(65) Prior Publication Data
US 2018/0341549 A1 Nov. 29, 2018

Related U.S. Application Data

(60) Provisional application No. 62/634,742, filed on Feb. 23, 2018, provisional application No. 62/634,738, (Continued)

(51) Int. Cl.
*G06F 11/00* (2006.01)
*G06F 11/10* (2006.01)
(Continued)

(52) U.S. Cl.
CPC ...... *G06F 11/1068* (2013.01); *G06F 11/1092* (2013.01); *G06F 11/2094* (2013.01);
(Continued)

(58) Field of Classification Search
CPC .................. G06F 11/10–1096; G06F 11/2094
See application file for complete search history.

(56) References Cited

U.S. PATENT DOCUMENTS 5,742,752 A * 4/1998 DeKoning .......... G06F 11/1076
714/6.22
6,092,215 A * 7/2000 Hodges ............... G06F 11/1076
711/114
(Continued)

FOREIGN PATENT DOCUMENTS

EP 1291780 B1 11/2007
WO 2016135872 A1 9/2016

OTHER PUBLICATIONS

International Search Report and Written Opinion dated Nov. 22, 2017 received in International Patent Application No. PCT/US2017/050194, which corresponds to U.S. Appl. No. 15/491,915, 14 pages. (Van Assche).

(Continued)

*Primary Examiner* — Michael Maskulinski
(74) *Attorney, Agent, or Firm* — Morgan, Lewis & Bockius LLP

(57) ABSTRACT

A system and method improve the performance of non-volatile memory storage by rebuilding, on the fly, "lost data" in response to a read request, which identifies data to be read or recovered, by identifying a parity data storage device in a set of data storage devices that contains parity corresponding to the identified data; sending a reconstruction request to a respective data storage device, which may be the parity data storage device or other data storage device in the system, to reconstruct the identified data, and receiving the identified data from the respective data storage device. The reconstruction request commands the respective data storage device to retrieve, via peer-to-peer read requests, from other data storage devices, data from one or more data blocks, and to reconstruct the identified data based on the retrieved data and parity data locally stored at the parity data storage device.

20 Claims, 14 Drawing Sheets

Related U.S. Application Data filed on Feb. 23, 2018, provisional application No. 62/511,326, filed on May 25, 2017.

(51) Int. Cl.
  *G06F 11/20* (2006.01)
  *H04L 29/08* (2006.01)
  *G11C 29/52* (2006.01)

(52) U.S. Cl.
  CPC ............ *G11C 29/52* (2013.01); *H04L 67/104* (2013.01); *G06F 2201/82* (2013.01)

(56) References Cited

U.S. PATENT DOCUMENTS

| | | | |
|---|---|---|---|
| 6,920,494 B2* | 7/2005 | Heitman | ............... G06F 3/0601 709/220 |
| 2012/0124312 A1 | 5/2012 | Vemuri et al. | |
| 2016/0110270 A1 | 4/2016 | Iwashita | |
| 2016/0179637 A1 | 6/2016 | Winokur | |
| 2016/0217049 A1 | 7/2016 | Bali et al. | |
| 2017/0286237 A1* | 10/2017 | Condict | .............. G06F 11/1662 |
| 2018/0018231 A1* | 1/2018 | Okada | ................... G06F 3/0619 |
| 2018/0095872 A1* | 4/2018 | Dreier | ..................... G06F 3/067 |
| 2018/0113761 A1* | 4/2018 | Ko | ........................ G06F 3/0619 |

OTHER PUBLICATIONS

International Patent Application No. PCT/US2018/026463, Notification of Transmittal of the International Search Report and the Written Opinion of the International Searching Authority, dated Aug. 3, 2018, 11 pages.

* cited by examiner

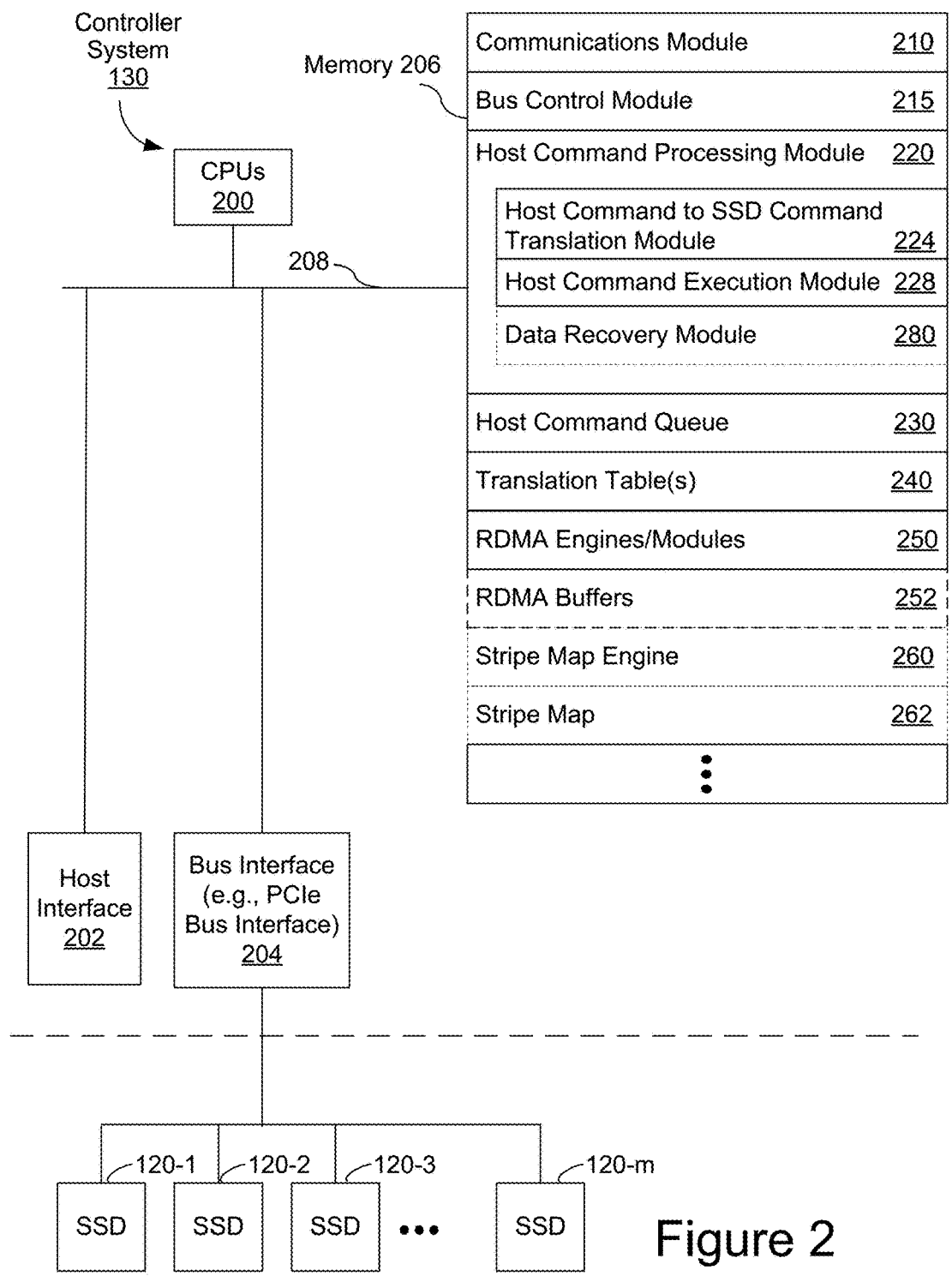
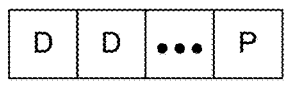
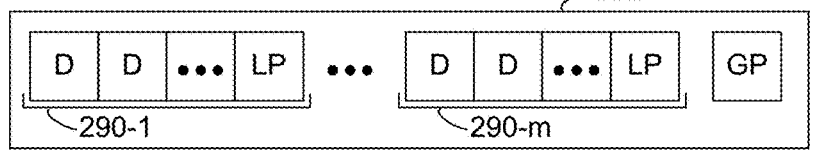
Figure 2
Figure 2A
Figure 2B

600

At a controller system, receive a compaction request to compact a first Redundancy Coding stripe and a second Redundancy Coding stripe into a third Redundancy Coding stripe in the plurality of data storage devices, the first Redundancy Coding stripe, the second Redundancy Coding stripe and the third Redundancy Coding stripe including storage locations in a set of data storage devices comprising three or more of the plurality of data storage devices ~602

604 The controller system is a host system external to the non-volatile memory system, and the compaction request is received from an application executed by the host system.

606 The controller system receives the compaction request from a host system external to the non-volatile memory system.

608 The controller system is one or more modules of a respective storage device of the plurality of storage devices In response to receiving the compaction request, the controller system performs a sequence of operations. ~612

614 Identify a first data storage device and a second data storage device in the set of data storage devices from which to read data for the first Redundancy Coding stripe and the second Redundancy Coding stripe, the identified first data storage device and the second data storage device including a controller, non-volatile memory and a data buffer.

616 Identify a third data storage device in the set of data storage devices at which to compute and store parity for the identified third Redundancy Coding stripe, the identified third data storage device including a controller, non-volatile memory and a data buffer (A)

At a controller system, receive a read request to read identified data from a failed data storage device in a set of data storage devices comprising three or more of the plurality of storage devices

| 712 The controller system is a host system external to the non-volatile memory system, and the read request is received from an application executed by the host system. | 714 The controller system receives the read request from a host system external to the non-volatile memory system. |

716 The controller system is one or more modules of a respective storage device of the plurality of storage devices

～710

In response to receiving the read request, the controller system performs a sequence of operations.

722 Identify, in the set of data storage devices, a parity data storage device that contains parity corresponding to the identified data 724 Send a reconstruction request, corresponding to the read request, to a respective data storage device comprising the parity data storage device or a data storage device other than the failed data storage device in the plurality of data storage devices, to reconstruct the identified data, wherein the reconstruction request commands the respective data storage device to retrieve, via peer-to-peer read requests, from other data storage devices in the set of data storage devices, data from one or more data blocks, and to reconstruct the identified data based on the retrieved one or more data blocks and parity data locally stored at the parity data storage device 726 Receive the identified data from the respective data storage device

DATA STORAGE DRIVE REBUILD WITH PARITY GENERATION OFFLOAD USING PEER-TO-PEER DATA TRANSFERS

RELATED APPLICATIONS

This application claims priority to U.S. Provisional Patent Application 62/634,742 filed on Feb. 23, 2018, "Data Storage Drive Rebuild with Parity Generation Offload Using Peer-to-Peer Data Transfers," U.S. Provisional Patent Application 62/634,738 filed on Feb. 23, 2018, "Parity Generation Offload Using Peer-to-Peer Data Transfers in Data Storage System," and U.S. Provisional Patent Application 62/511,326, filed on May 25, 2017, "Parity Offload for Multiple Solid State Drive Devices," each of which is incorporated herein by reference in its entirety.

TECHNICAL FIELD

The disclosed embodiments relate generally to memory systems, and in particular, to generating parity for data to be stored on multiple non-volatile data storage devices (e.g., solid state drives) in a data storage system.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information. When non-volatile memory systems are implemented in storage networks, such as disaggregated storage networks, central processing unit (CPU) systems are situated between network connected hosts and non-volatile memory to facilitate storage. The CPU systems receive and buffer data in memory, such as DRAM memory, while the data is routed between the network host and the non-volatile memory storage for reading or writing data. The CPU systems and their associated buffers, however, have not been keeping up with the speeds of networks and non-volatile memory storage and have become a bottleneck.

One aspect of the performance bottleneck is computing parity for data written to data storage systems, such as solid state drive systems. If parity is generated in a host or in intermediate CPU systems situated between network connected hosts and non-volatile memory, the parity computation becomes a further bottleneck for high-performance writes. Therefore, it would be desirable to avoid having to perform parity computations on the host(s) or intermediate CPU systems situated between network connected hosts and non-volatile memory.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description," one will understand how the aspects of various embodiments are used to enable higher throughput in storage to memory devices.

The disclosed system and method improve the performance of non-volatile memory storage by rebuilding, on the fly, "lost data" in response to a read request, which identifies data to be read or recovered, by identifying a parity data storage device in a set of data storage devices that contains parity corresponding to the identified data; sending a reconstruction request to a respective data storage device, which may be the parity data storage device or other data storage device in the system, to reconstruct the identified data, and receiving the identified data from the respective data storage device. The reconstruction request commands the respective data storage device to retrieve, via peer-to-peer read requests, from other data storage devices, data from one or more data blocks, and to reconstruct the identified data based on the retrieved data and parity data locally stored at the parity data storage device.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIG. 2 is a block diagram illustrating an implementation of a controller, in accordance with some embodiments.

FIG. 2A shows an example of a Redundancy Coding stripe having one or more parity data storage devices (e.g., SSDs), while FIG. 2B shows an example of a Redundancy Coding stripe having two or more mini-stripes, each mini-stripe having multiple data storage devices and one or more local parity data storage devices, and a global parity data storage device.

FIGS. 6A-6C illustrate a flowchart representation of a method of offloading parity generation to one or more data storage devices during data compaction using peer-to-peer data transfers, in accordance with some embodiments.

FIG. 7 illustrates a flowchart representation of a method of processing a read request to read identified data from a failed data storage device using peer-to-peer data transfers, in accordance with some embodiments.

Figure 1A:
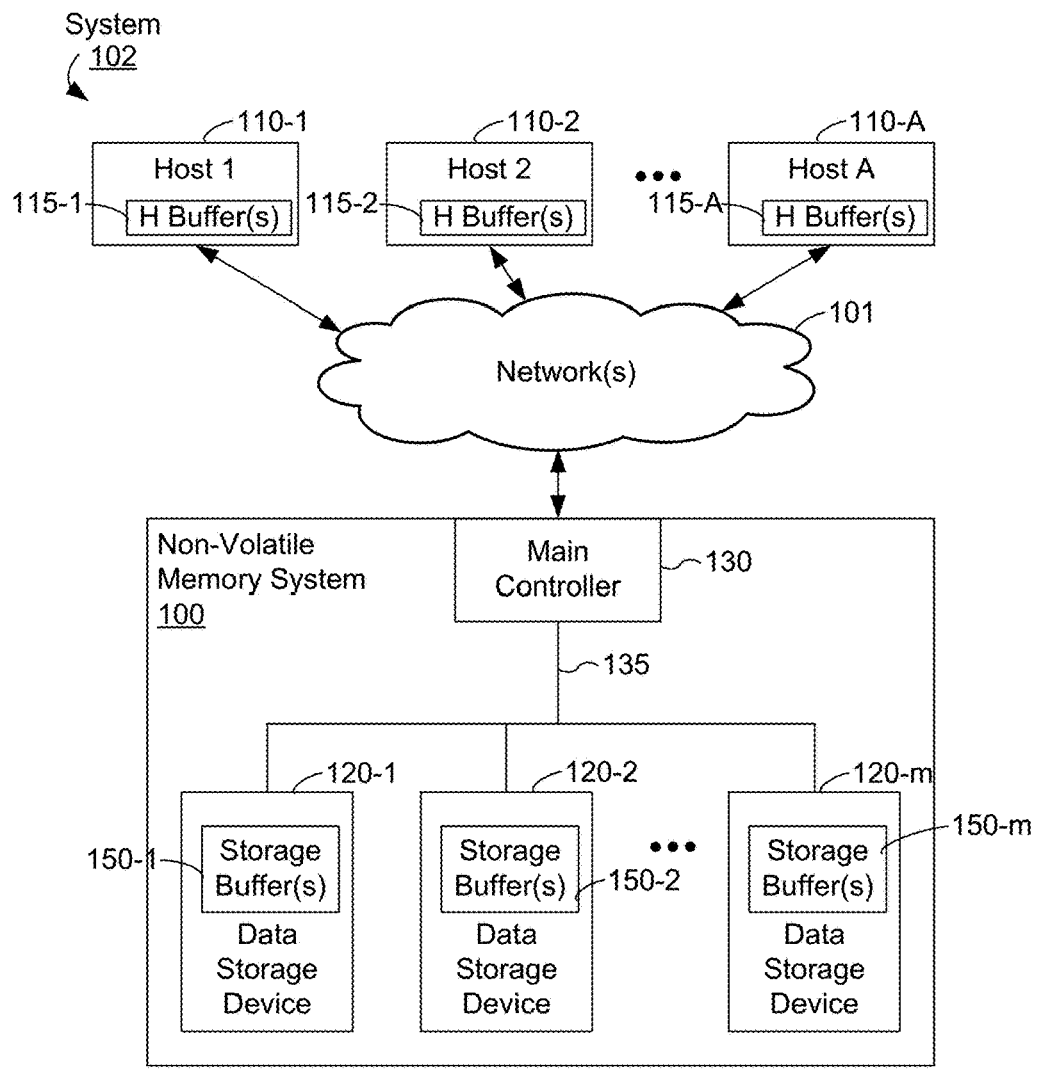
FIG. 1A is a block diagram illustrating a distributed computing system that includes an implementation of a non-volatile memory system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems (e.g., data storage systems), methods and/or devices used to store data and recover from data losses, for example due to media degradation. Some implementations include systems, methods and/or devices to enable higher throughput in storage to data storage devices. Typically, each data storage device in the data storage system includes non-volatile memory, typically implemented as a plurality of non-volatile memory devices, such as flash memory chips; and a controller for managing data access operations (e.g., reading, writing, erasing and/or invalidating, etc.) that access data in the data storage device's non-volatile memory. The controller of each data storage device in the data storage system typically includes hardware and/or software for translating logical addresses in data access commands received by the data storage device into physical addresses or physical memory locations at which data is stored within the data storage device's non-volatile memory.

(A1) More specifically, some embodiments include a method of managing data storage in a non-volatile memory system that includes plurality of data storage devices. The method comprises, at a controller system, receiving a compaction request to compact a first Redundancy Coding stripe and a second Redundancy Coding stripe into a third Redundancy Coding stripe in the plurality of data storage devices, the first Redundancy Coding stripe, the second Redundancy Coding stripe and the third Redundancy Coding stripe including storage locations in a set of data storage devices comprising three or more of the plurality of data storage devices; in response to receiving the compaction request, the controller system performing a sequence of operations, including: identifying a first data storage device and a second data storage device in the set of data storage devices from which to read data for the first Redundancy Coding stripe and the second Redundancy Coding stripe, the identified first data storage device and the second data storage device each including a controller, non-volatile memory and a data buffer; identifying a third data storage device in the set of data storage devices at which to compute and store parity for the identified third Redundancy Coding stripe, the identified third data storage device including a controller, non-volatile memory and a data buffer; sending one or more data transfer commands to the first data storage device and the second data storage device to locally copy valid blocks from the first Redundancy Coding stripe and the second Redundancy Coding stripe to the third Redundancy Coding stripe within the respective data storage devices; and sending a parity rebuild command to the third data storage device to rebuild parity for the third Redundancy Coding stripe, wherein rebuilding parity for the third Redundancy Coding stripe includes obtaining data in the third Redundancy Coding stripe from the first data storage device using peer-to-peer data transfers from the first data storage device to the third data storage device and obtaining data in the third Redundancy Coding stripe from the second data storage device using peer-to-peer data transfers from the second data storage device to the third data storage device.

(A2) In some embodiments of the method of A1, the one or more data transfer commands includes: sending a first data transfer command to the first data storage device to locally copy valid blocks from the first Redundancy Coding stripe to the third Redundancy Coding stripe within the first data storage device; sending a second data transfer command to the second data storage device to locally copy valid blocks from the first Redundancy Coding stripe to the third Redundancy Coding stripe within the second data storage device; sending a third data transfer command to the first data storage device to locally copy valid blocks from the second Redundancy Coding stripe to the third Redundancy Coding stripe within the first data storage device; and sending a fourth data transfer command to the first data storage device to locally copy valid blocks from the second Redundancy Coding stripe to the third Redundancy Coding stripe, within the second data storage device.

(A3) In some embodiments of the method of A1, the parity rebuild command further instructs the third data storage device to compute parity for the third Redundancy Coding stripe.

(A4) In some embodiments of the method of A3, the parity rebuild command further instructs the third data storage device to locally write the computed parity, within the third data storage device, to the third Redundancy Coding stripe.

(A5) In some embodiments of the method of A2, the first data transfer command, the second data transfer command, the third data transfer command and the fourth data transfer command are configured to cause a copy of the valid blocks to be sent to one or more volatile memory buffers on the third data storage device.

(A6) In some embodiments of the method of A5, the parity rebuild command instructs the third data storage device to rebuild parity for the third Redundancy Coding stripe from the data in the one or more volatile memory buffers.

(A7) In some embodiments of the method of A6, the parity rebuild command further instructs the third data storage device to locally write the computed parity, within the third data storage device, to the third Redundancy Coding stripe.

(A8) In some embodiments of the method of any of A1-A7, the controller system is a host system external to the non-volatile memory system, and the compaction request is received from an application executed by the host system.

(A9) In some embodiments of the method of any of A1-A7, the controller system receives the compaction request from a host system external to the non-volatile memory system.

(A10) Some embodiments include a method of managing data storage in a non-volatile memory system that includes plurality of data storage devices. The method comprises, at a controller system, receiving a read request to read identified data from a failed data storage device in a set of data storage devices comprising three or more of the plurality of data storage devices; and in response to receiving the read request, the controller system performing a sequence of operations, including: identifying a parity data storage device in the set of data storage devices that contains parity corresponding to the identified data; sending a reconstruction request, corresponding to the read request, to a respective data storage device comprising the parity data storage device or a data storage device other than the failed data storage device in the plurality of data storage devices, to reconstruct the identified data, wherein the reconstruction request commands the respective data storage device to retrieve, via peer-to-peer read requests, from other data storage devices in the set of data storage devices, data from one or more data blocks, and to reconstruct the identified data based on the retrieved data from the one or more data blocks and parity data locally stored at the parity data storage device; and receiving the identified data from the respective data storage device.

(A11) In some embodiments of the method of A10, the controller system is a host system external to the non-volatile memory system, and the read request is received from an application executed by the host system.

(A12) In some embodiments of the method of A10, the controller system receives the read request from a host system external to the non-volatile memory system.

(A13) Some embodiments include a method of managing data storage in a non-volatile memory system that includes plurality of data storage devices. The method comprises, at a controller system, receiving a drive rebuild request to rebuild, in a replacement data storage device in a set of data storage devices comprising three or more of the plurality of data storage devices, contents of a failed data storage device; in response to receiving the drive rebuild request, the controller system performing a sequence of operations, including: identifying a parity data storage device in the set of data storage devices that contains parity corresponding to the replaced data storage device; sending the identity of the parity data storage device to the replacement data storage device; and for each range of blocks that stored at least some valid data in the failed data storage device, sending a block range rebuild request to the replacement data storage device to rebuild the range of blocks; wherein the block range rebuild request commands the replacement data storage device to receive, via peer-to-peer read requests, from other data storage devices in the set of data storage device, one or more data blocks and a parity block, and to reconstruct data corresponding to the range of blocks based on the one or more data blocks and parity block received via the peer-to-peer read requests.

(A14) In some embodiments of the method of A13, the controller system is a host system external to the non-volatile memory system, and the drive rebuild request is received from an application executed by the host system.

(A15) In some embodiments of the method of A13, the controller system receives the drive rebuild request from a host system external to the non-volatile memory system.

(A16) In some embodiments of the method of any of A1-A7, A9-A10, A12-A13, and A15, the controller system is one or more modules of a respective data storage device of the plurality of data storage devices.

(A17) In some embodiments, a memory controller comprises a storage interface, a communication interface, and a command processing module. The storage interface couples the memory controller to a plurality of data storage devices. The communication interface receives compaction requests, each compaction request comprising a request to compact a first Redundancy Coding stripe and a second Redundancy Coding stripe into a third Redundancy Coding stripe in the plurality of data storage devices, the first Redundancy Coding stripe, the second Redundancy Coding stripe and the third Redundancy Coding stripe including storage locations in a set of data storage devices comprising three or more of the plurality of data storage devices. The command processing module processes a respective compaction request by performing a sequence of operations, including: identifying a first data storage device and a second data storage device in the set of data storage devices from which to read data for the first Redundancy Coding stripe and the second Redundancy Coding stripe, the identified first data storage device and the second data storage device including a controller, non-volatile memory and a data buffer; identifying a third data storage device in the set of data storage devices at which to compute and store parity for the identified third Redundancy Coding stripe, the identified third data storage device including a controller, non-volatile memory and a data buffer; sending one or more data transfer commands to the first data storage device and the second data storage device to locally copy valid blocks from the first Redundancy Coding stripe and the second Redundancy Coding stripe to the third Redundancy Coding stripe within the respective data storage devices; and sending a parity rebuild command to the third data storage device to rebuild parity for the third Redundancy Coding stripe, wherein rebuilding parity for the third Redundancy Coding stripe includes obtaining data in the third Redundancy Coding stripe from the first data storage device using peer-to-peer data transfers from the first data storage device to the third data storage device and obtaining data in the third Redundancy Coding stripe from the second data storage device using peer-to-peer data transfers from the second data storage device to the third data storage device.

(A18) In some embodiments of the memory controller of A17, each data storage device of the plurality of data storage devices in the non-volatile memory system includes non-volatile memory for durably storing information, one or more data buffers for temporarily storing information being written to or read from the non-volatile memory of the data storage device, and a storage controller for controlling operation of the data storage device, including execution of read and write commands.

(A19) In some embodiments of the memory controller of A17, the non-volatile memory of each data storage device of the plurality of data storage devices comprises flash memory, and the one or more data buffers of each data storage device of the plurality of data storage devices comprises non-volatile RAM.

(A20) In some embodiments of the memory controller of any of A17-A19, the memory controller is configured to perform and/or initiate the performance of the method of any of A2 to A9.

(A21) In some embodiments, a non-transitory computer readable storage medium stores one or more programs configured for execution by a memory controller configured to be coupled to a plurality of data storage devices. The one or more programs include instructions that when executed by one or more processors of the memory controller, cause the memory controller to receive compaction requests, each compaction request comprising a request to compact a first Redundancy Coding stripe and a second Redundancy Coding stripe into a third Redundancy Coding stripe in the plurality of data storage devices, the first Redundancy Coding stripe, the second Redundancy Coding stripe and the third Redundancy Coding stripe including storage locations in a set of data storage devices comprising three or more of the plurality of data storage devices. The one or more programs also include instructions that when executed by one or more processors of the memory controller, cause the memory controller to process a respective compaction request by performing a sequence of operations, including: identifying a first data storage device and a second data storage device in the set of data storage devices from which to read data for the first Redundancy Coding stripe and the second Redundancy Coding stripe, the identified first data storage device and the second data storage device including a controller, non-volatile memory and a data buffer; identifying a third data storage device in the set of data storage devices at which to compute and store parity for the identified third Redundancy Coding stripe, the identified third data storage device including a controller, non-volatile memory and a data buffer; sending one or more data transfer commands to the first data storage device and the second data storage device to locally copy valid blocks from the first Redundancy Coding stripe and the second Redundancy Coding stripe to the third Redundancy Coding stripe within the respective data storage devices; and sending a parity rebuild command to the third data storage device to rebuild parity for the third Redundancy Coding stripe, wherein rebuilding parity for the third Redundancy Coding stripe includes obtaining data in the third Redundancy Coding stripe from the first data storage device using peer-to-peer data transfers from the first data storage device to the third data storage device and obtaining data in the third Redundancy Coding stripe from the second data storage device using peer-to-peer data transfers from the second data storage device to the third data storage device.

(A22) In some embodiments, the non-transitory computer readable storage medium of (A21), wherein the one or more programs include instructions for performing the method of any of A2 to A9.

(A23) In some embodiments, a memory controller comprises a storage interface, a communication interface, and a command processing module. The storage interface couples the memory controller to a plurality of data storage devices. The communication interface receives read requests, each read request comprising a request to read identified data from a failed data storage device in a set of data storage devices comprising three or more of the plurality of data storage devices. The command processing module processes a respective read request by performing a sequence of operations, including: identifying a parity data storage device in the set of data storage devices that contains parity corresponding to the identified data; sending a reconstruction request, corresponding to the read request, to a respective data storage device comprising the parity data storage device or a data storage device other than the failed data storage device in the plurality of data storage devices, to reconstruct the identified data, wherein the reconstruction request commands the respective data storage device to retrieve, via peer-to-peer read requests, from other data storage devices in the set of data storage devices, data from one or more data blocks, and to reconstruct the identified data based on the retrieved data from the one or more data blocks and parity data locally stored at the parity data storage device; and receiving the identified data from the respective data storage device (A24) In some embodiments of the memory controller of A23, each data storage device of the plurality of data storage devices in the non-volatile memory system includes non-volatile memory for durably storing information, one or more data buffers for temporarily storing information being written to or read from the non-volatile memory of the data storage device, and a storage controller for controlling operation of the data storage device, including execution of read and write commands.

(A25) In some embodiments of the memory controller of A23, the non-volatile memory of each data storage device of the plurality of data storage devices comprises flash memory, and the one or more data buffers of each data storage device of the plurality of data storage devices comprises non-volatile RAM.

(A26) In some embodiments of the memory controller of any of A23-A25, the memory controller is configured to perform and/or initiate the performance of the method of any of A11 to A12.

(A27) In some embodiments, a non-transitory computer readable storage medium stores one or more programs configured for execution by a memory controller configured to be coupled to a plurality of data storage devices. The one or more programs include instructions that when executed by one or more processors of the memory controller, cause the memory controller to receive read requests, each read request comprising a request to read identified data from a failed data storage device in a set of data storage devices comprising three or more of the plurality of data storage devices. The one or more programs also include instructions that when executed by one or more processors of the memory controller, cause the memory controller to process a respective read request by performing a sequence of operations, including: identifying a parity data storage device in the set of data storage devices that contains parity corresponding to the identified data; sending a reconstruction request, corresponding to the read request, to a respective data storage device comprising the parity data storage device or a data storage device other than the failed data storage device in the plurality of data storage devices, to reconstruct the identified data, wherein the reconstruction request commands the respective data storage device to retrieve, via peer-to-peer read requests, from other data storage devices in the set of data storage devices, data from one or more data blocks, and to reconstruct the identified data based on the retrieved data from the one or more data blocks and parity data locally stored at the parity data storage device; and receiving the identified data from the respective data storage device.

(A28) In some embodiments, the non-transitory computer readable storage medium of (A27), wherein the one or more programs include instructions for performing the method of any of A11 to A12.

(A29) In some embodiments, a memory controller comprises a storage interface, a communication interface, and a command processing module. The storage interface couples the memory controller to a plurality of data storage devices. The communication interface receives drive rebuild requests, each drive rebuild request comprising a request to rebuild, in a replacement data storage device in a set of data storage devices comprising three or more of the plurality of data storage devices, contents of a failed data storage device. The command processing module processes a respective drive rebuild request by performing a sequence of operations, including: identifying a parity data storage device in the set of data storage devices that contains parity corresponding to the replaced data storage device; sending the identity of the parity data storage device to the replacement data storage device; and for each range of blocks that stored at least some valid data in the failed data storage device, sending a block range rebuild request to the replacement data storage device to rebuild the range of blocks; wherein the block range rebuild request commands the replacement data storage device to receive, via peer-to-peer read requests, from other data storage devices in the set of data storage device, one or more data blocks and a parity block, and to reconstruct data corresponding to the range of blocks based on the one or more data blocks and parity block received via the peer-to-peer read requests.

(A30) In some embodiments of the memory controller of A29, each data storage device of the plurality of data storage devices in the non-volatile memory system includes non-volatile memory for durably storing information, one or more data buffers for temporarily storing information being written to or read from the non-volatile memory of the data storage device, and a storage controller for controlling operation of the data storage device, including execution of read and write commands.

(A31) In some embodiments of the memory controller of A29, the non-volatile memory of each data storage device of the plurality of data storage devices comprises flash memory, and the one or more data buffers of each data storage device of the plurality of data storage devices comprises non-volatile RAM.

(A32) In some embodiments of the memory controller of any of A29-A31, the memory controller is configured to perform and/or initiate the performance of the method of any of A14 to A15.

(A33) In some embodiments, a non-transitory computer readable storage medium stores one or more programs configured for execution by a memory controller configured to be coupled to a plurality of data storage devices. The one or more programs include instructions that when executed by one or more processors of the memory controller, cause the memory controller to receive drive rebuild requests, each drive rebuild request comprising a request to rebuild, in a replacement data storage device in a set of data storage devices comprising three or more of the plurality of data storage devices, contents of a failed data storage device. The one or more programs also include instructions that when executed by one or more processors of the memory controller, cause the memory controller to process a respective drive rebuild request by performing a sequence of operations, including: identifying a parity data storage device in the set of data storage devices that contains parity corresponding to the replaced data storage device; sending the identity of the parity data storage device to the replacement data storage device; and for each range of blocks that stored at least some valid data in the failed data storage device, sending a block range rebuild request to the replacement data storage device to rebuild the range of blocks; wherein the block range rebuild request commands the replacement data storage device to receive, via peer-to-peer read requests, from other data storage devices in the set of data storage device, one or more data blocks and a parity block, and to reconstruct data corresponding to the range of blocks based on the one or more data blocks and parity block received via the peer-to-peer read requests.

(A34) In some embodiments, the non-transitory computer readable storage medium of (A33), wherein the one or more programs include instructions for performing the method of any of A14 to A15.

Numerous details are described herein to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

Even though solid state drives are but one example of the data storage devices discussed in this document, in several of the figures, data storage devices 120 are labeled "SSD" and storage buffers 150 are labeled "SSD buffer 150" or "buffer 150" to conserve space.

FIG. 1A is a block diagram illustrating a distributed system 102 that includes an implementation of a non-volatile memory system 100, coupled over a network 101 to a plurality of host systems 110 (sometimes called host computer systems, host devices, or hosts) in accordance with some embodiments. In some embodiments, non-volatile memory system 100 includes a non-volatile data storage device 120 (also sometimes called an information storage device, or a storage device, or a memory device). Data storage device 120 may include a single flash memory device, or a plurality of flash memory devices that are NAND-type flash memory or NOR-type flash memory. In some embodiments, data storage device 120 may include one or more hard disk drives (HDDs). In some embodiments, data storage device 120 includes one or more three-dimensional (3D) non-volatile memory devices. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, non-volatile memory system 100 (sometimes called a data storage system) includes one or more non-volatile data storage devices 120.

In FIG. 1A, host systems 110 are coupled to a controller system 130 of non-volatile storage system 100 through network 101. However, in some embodiments a respective host system 110 includes a storage controller, or a portion of controller system 130, as a component and/or as a subsystem. For example, in some embodiments, some or all of the functionality of storage controller 130 is implemented by software or hardware within at least one of the host systems 110. A respective host computer system 110 may be any suitable computer device, such as a computer, a laptop computer, a tablet device, a netbook, an internet kiosk, a personal digital assistant, a mobile phone, a smart phone, a gaming device, a computer server, or any other computing device. Each host computer system 110 is sometimes called a host, host system, client, or client system. In some embodiments, a respective host computer system 110 is a server system, such as a server system in a data center. In some embodiments, a respective host computer system 110 includes one or more processors, one or more types of memory, a display and/or other user interface components such as a keyboard, a touch-screen display, a mouse, a track-pad, a digital camera, and/or any number of supplemental I/O devices to add functionality to host computer system 110. In some embodiments, host computer system 110 does not have a display and other user interface components.

Within the illustrative non-volatile memory system 100, a controller system 130 is coupled to network 101 and to one or more data storage devices 120 through connections 135. Controller system 130 is a controller for controlling access to data storage devices 120 and bi-directional processing of read and write commands and associated data between networked host systems 110 and data storage devices 120, such as solid state disk drives (SSDs). The controller may be a non-volatile memory express (NVMe) controller, a Redundancy Coding controller (e.g., a redundant array of independent disks (RAID) controller), or as described in further detail below another type of CPU or processor for controlling access to non-volatile storage devices. In some embodiments, controller system 130 is a host system 110, a module or subsystem of a host system 110, or a controller module in a data storage device. Network 101 and connections 135 are sometimes called data connections, but typically convey commands in addition to data, and optionally convey metadata, error correction information and/or other information in addition to data values to be stored in data storage devices 120 and data values read from data storage devices 120. In some embodiments, however, controller 130 and data storage devices 120 are included in the same device (i.e., an integrated device) as components thereof. Furthermore, in some embodiments, data storage devices 120 are embedded in a host device (e.g., computer system 110), such as a mobile device, tablet, other computer or computer controlled device, and the methods described herein are performed, at least in part, by the embedded storage controller.

In some embodiments, data storage devices 120 include any number (i.e., one or more) of memory devices including, without limitation, persistent memory or non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally, and/or alternatively, flash memory device(s) can also be configured for relatively smaller-scale applications such as personal flash drives or hard-disk replacements for personal, laptop, and tablet computers.

Data storage devices 120 further include buffers 150 (sometimes called storage buffers) that may be allocated by the controller system 130 as part of its directly accessible memory space for use when writing data to or reading data from data storage devices 120 using remote DMA operations. Similarly, a host system 110 may include a host buffer 115 that is directly accessible by the controller system 130 during remote DMA operations.

Figure 3:
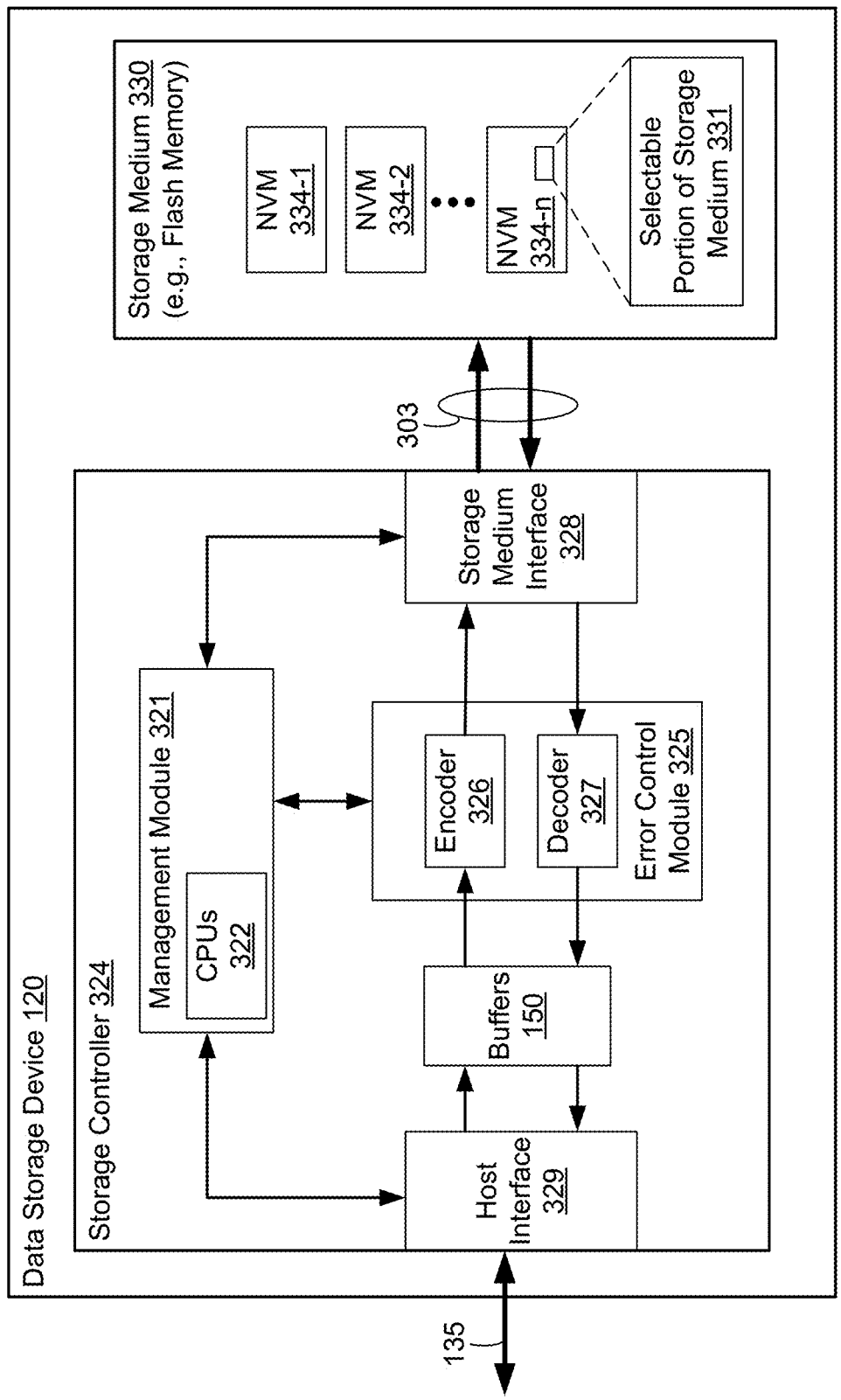
FIG. 3 is a block diagram of a data storage device that is part of a non-volatile memory system, in accordance with some embodiments.

Referring to FIG. 3, each data storage device 120 includes a storage controller 324 (e.g., a solid state drive controller, sometimes called an SSD controller) and a storage medium 330. Storage medium 330 includes memory devices (e.g., NVM 334-1, NVM 334-2, etc.), each of which include addressable and individually selectable blocks. Storage medium 330 includes individually selectable portions 331 (also referred to herein as a selected portion 331). In some embodiments, the individually selectable blocks (sometimes called erase blocks) are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for writing data to or reading data from the flash memory device.

In some embodiments, storage controller 324 includes a management module 321, a host interface 329, storage buffers 150, an error control module 325 and a storage medium interface 328. Storage controller 324 may include various additional features that have not been illustrated for the sake of brevity and so as not to obscure pertinent features of the example embodiments disclosed herein, and a different arrangement of features may be possible. Host interface 329 provides an interface, for devices external to data storage device 120, to the data storage device 120 through data connections 135, and provides an interface for data storage device 120 to devices (e.g., host systems 110 and other data storage devices 120) external to data storage device 120. Host interface 329 is sometimes called a bus interface. Similarly, storage medium interface 328 provides an interface to storage medium 330 through connections 303. In some embodiments, storage medium interface 328 includes read and write circuitry, including circuitry capable of providing reading signals to storage medium 330 (e.g., reading threshold voltages for NAND-type flash memory).

In some embodiments, storage buffers 150 are implemented using non-volatile random access memory (sometimes called non-volatile RAM or NVRAM), such as battery-backed dynamic random access memory (DRAM). At least some of the storage buffers 150 may be directly accessible to not only the memory management module 321, but also the controller system 130 (FIG. 1A) via data connections 135, which may be any suitable bus or network, and may use any suitable protocol, such as SATA or PCI express. In some embodiments, storage buffers 150 are allocated by the controller system 130 and the data storage device 120 to facilitate remote DMA operations between a host 110 and a data storage device 120.

In some embodiments, management module 321 includes one or more processing units 322 (sometimes herein called CPUs, processors, or hardware processors, and sometimes implemented using microprocessors, microcontrollers, or the like) configured to execute instructions in one or more programs (e.g., in management module 321). In some embodiments, the one or more CPUs 322 are shared by one or more components within, and in some cases, beyond the function of storage controller 324. However, in some embodiments, management module 321 does not include any CPUs or processors that execute instructions in one or more programs, and instead includes an application specific integrated circuit (ASIC) or field programmable gate array (FPGA) that implements one or more state machines to perform the functions of management module 321.

Management module 321 is coupled to host interface 329, error control module 325 and storage medium interface 328 in order to coordinate the operation of these components. In some embodiments, one or more modules of management module 321 are implemented by a host computer system 110. Management module 321 is coupled to storage medium 330, via storage medium interface 328, in order to manage the operation of storage medium 330.

Error control module 325 is coupled to storage medium interface 328, storage buffers 150, and management module 321. Error control module 325 is provided to limit the number of uncorrectable errors inadvertently introduced into data during writes to memory or reads from memory. In some embodiments, error control module 325 is executed in software by the one or more CPUs 322 of management module 321, and, in other embodiments, error control module 325 is implemented in whole or in part using special purpose circuitry to perform data encoding and decoding functions. To that end, error control module 325 includes an encoder 326 and a decoder 327. Encoder 326 encodes data by applying an error control code to produce a codeword, which is subsequently stored in storage medium 330.

When the encoded data (e.g., one or more codewords) is read from storage medium 330, decoder 327 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, a respective buffer 150 (sometimes called an input buffer or allocated buffer) receives data to be stored in storage medium 330 from computer system 110 via a remote DMA operation that is controlled by controller system 130 of memory system 100. The data held in the allocated buffer 150 is made available to encoder 326, which encodes the data to produce one or more codewords. The one or more codewords are made available to storage medium interface 328, which transfers the one or more codewords to storage medium 330 in a manner dependent on the type of storage medium being utilized. To initiate the write, the memory management module 321 receives from the controller system 130 a translated write command, which includes information sufficient to transfer the data to be written from the allocated buffer 150 to a location in the storage medium 330. In some embodiments, memory management module 321 includes completion logic that notifies controller system 130 when the data associated with the command has been written from to the allocated buffer 150.

A read operation is initiated when a respective host computer system 110 sends a host read command (e.g., in a set of one or more host read commands, sent, for example, via network 101) to the controller system 130, which translates the received host read command (e.g., into a lower level data storage device command, sometimes herein called a translated command, suitable for execution by a data storage device 120) and sends the translated command to the storage controller 324 of a respective data storage device 120 (see FIG. 1A), requesting data from storage medium 330. Storage controller 324 sends one or more read access commands to storage medium 330, via storage medium interface 328, to transfer raw read data in accordance with memory locations (addresses) specified by the one or more host read commands. Storage medium interface 328 provides the raw read data (e.g., comprising one or more codewords) to decoder 327. If the decoding is successful, the decoded data is provided to an output buffer 150 allocated by the controller system 130, where the decoded data is made available to computer system 110 via a remote DMA operation using the controller system 130. In some embodiments, if the decoding is not successful, storage controller 324 may resort to a number of remedial actions or provide an indication of an irresolvable error condition. The memory management module 321 may further include completion logic that notifies the controller system 130 when the data associated with the command is in the allocated buffer 150 and ready to be sent directly to the host via RDMA.

Figure 1B:
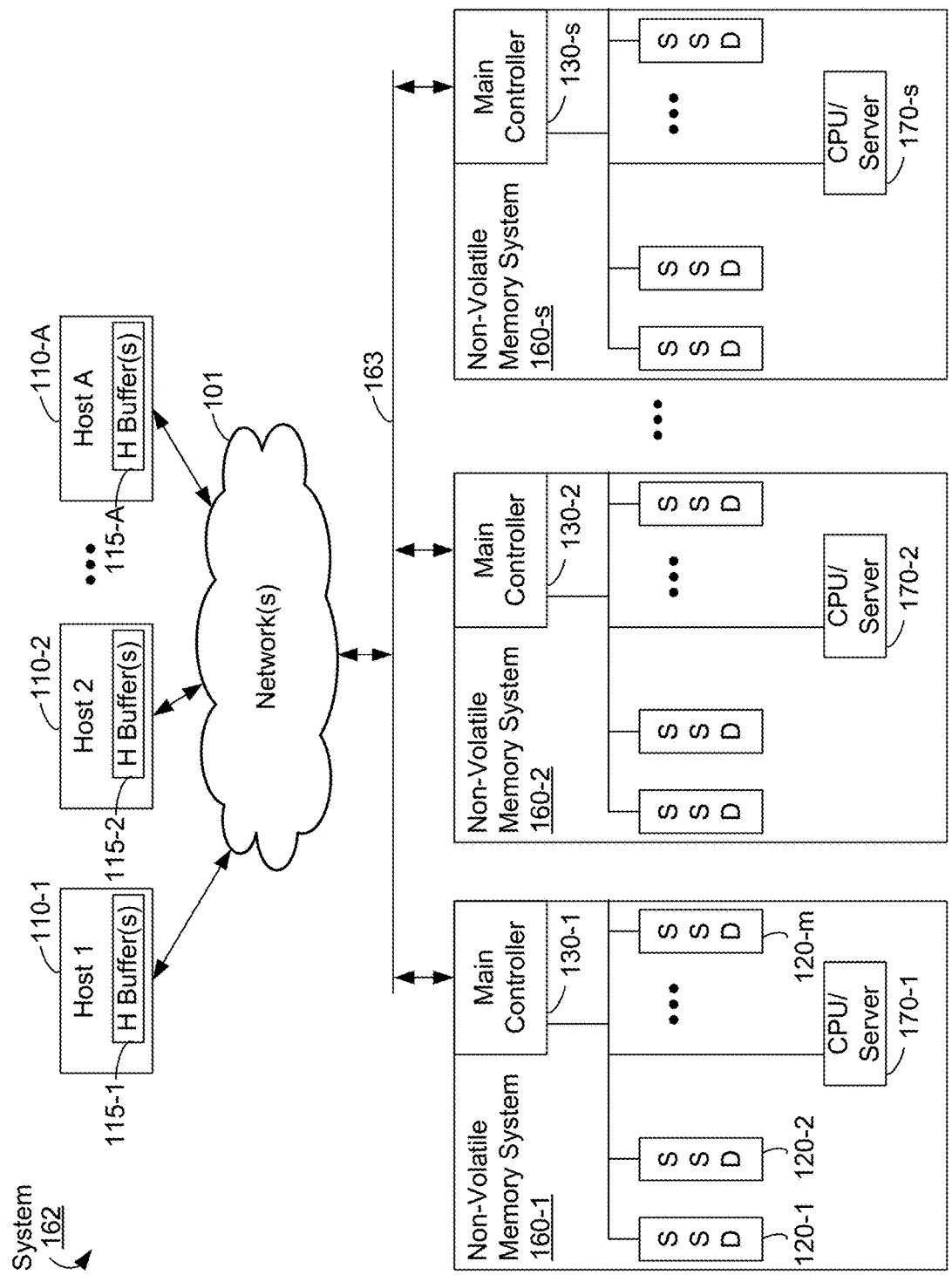
FIG. 1B is a block diagram illustrating a distributed computing system that includes one or non-volatile memory systems that include a compute engine or server, in accordance with some embodiments.

FIG. 1B is a block diagram illustrating a distributed computing system 162 that is similar to distributed system 102 (FIG. 1A). However, system 162 includes one or more non-volatile memory systems 160 that each include a compute engine or server 170, in accordance with some embodiments. Those aspects of system 162 that are the same or similar to system 102, FIG. 1A, have the same reference numbers, and to the extent they are the same as in system 102, will not be discussed again, to avoid needless repetition. As shown in FIG. 1B, system 162 includes two or more non-volatile memory systems 160 (e.g., NVM systems 160-1, 160-2 to 160-s, where s is an integer greater than 1), which are sometimes collectively called storage system 180. In some embodiments, system 162 includes at least one, and in some embodiments, system at least two NVM systems 160 that each include an internal compute engine or server 170. In FIG. 1B, NVM systems 160 are shown as being interconnected by a network or communication bus 163. Functionally, and for purposes of the explanations that follow, network or communication bus 163 is included in network(s) 101. However, in some embodiments, network of communication bus 163 is separate from network(s) 101, and instead is part of storage system 180 instead of network(s) 101.

In some such embodiments, the compute engine/server 170 (e.g., 170-1, 170-2 or 170-s) of the respective NVM system 160 is a compute engine that includes a hardware processor (e.g., a microprocessor, ASIC, state machine, or the like) and working memory (e.g., DRAM, SRAM, or other random access memory), for executing programs sent to it by one or more of hosts 110, herein called the requesting host for ease of explanation. For example, such program may be used to perform data intensive tasks, such as data mining, data analysis, report generation, etc., and to then send the results of those tasks back to the requesting host. In this way, large quantities of data needed for the data intensive tasks need not be transported across network(s) 101 to the requesting host, and instead only the programs and results are transported across network(s) 101.

In some other embodiments, the compute engine/server 170 is a server that includes a hardware processor (e.g., a microprocessor, ASIC, or the like) and working memory (e.g., DRAM, SRAM, or other random access memory), for executing programs, hosting applications, and providing services to client systems (e.g., any of hosts 110, as well as other client systems not shown in FIG. 1B). Thus, each NVM system 160 in such embodiments is an integrated host/server and storage system. In some such embodiments, host systems 110 are embedded in NVM systems 160, implemented using compute engines/servers 170. In some such embodiments, communication bus 163 effectively replaces network 101 for communications between the host systems/servers 170.

In both types of embodiments described above, compute engine/server 170 accesses information in the data storage devices (e.g., SSDs) of its NVM system 160 directly, using standard SSD access protocols, without going through controller system 130. However, to the extent it needs to access information stored in any of the data storage devices 120 of any of the other NVM systems 160, it is functionally the same as a host 110, conveying its request(s) to the other NVM system 160 via network(s) 101 (which includes network/communication bus 163, as explained above), and the controller system 130 of that NVM system 160.

FIG. 2 is a block diagram illustrating an implementation of a controller system 130, in accordance with some embodiments. In some embodiments, controller system 130 includes one or more processors 200, sometimes called CPUs, or hardware processors, or microcontrollers; host interface 202 for coupling controller system 130 to one or more host systems 110 (FIG. 1A); bus interface 204 for coupling controller system to one or more communication busses (e.g., connections 135, FIG. 1A); memory 206

(sometimes herein called controller memory); and one or more communication buses 208 for interconnecting these components. Communication buses 208 optionally include circuitry (sometimes called a chipset) that interconnects and controls communications between system components.

Controller system 130 generally facilitates getting data into and out of non-volatile memory in data storage devices 120. Controller system 130 exchanges data over network 101 with host systems 110 via host interface 202. In some embodiments, controller system 130 may be a Redundancy Coding controller (e.g., a RAID controller) for storing and accessing data in an array of data storage devices (e.g., data storage devices 120). The one or more processors 200 execute modules, programs and/or instructions stored in memory 206 and thereby perform processing operations. In some embodiments, the one or more processors 200 are coupled to data storage devices 120 by communication buses 208. In other embodiments the coupling is indirect through, for example, bus interface 204, such as a PCI express bus interface. Other bus interfaces, including a SATA bus interface may also be used.

Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from processor(s) 200. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset or superset thereof:

communications module 210 used for communicating with other components, such as data storage devices 120, and host computer systems 110;

a bus control module 215 used for executing bus protocols and transferring data over busses between components;

a host command processing module 220 that receives commands (e.g., read and write commands) from host systems 110, allocates storage buffers 150 in data storage devices, and translates the host commands into data storage device commands to facilitate remote DMA transfers of data corresponding to the read and write commands between host buffers on host systems 110 and storage buffers 150 on associated data storage devices 120. To facilitate the translation of host commands, host command processing module 220 may include a host command to data storage device command (e.g., SSD command) translation module 224, which converts host commands into commands suitable for execution by data storage device 120, and optionally facilitates virtualizing addresses embedded in the host commands. Host command processing module 220 may further include a host command execution module 228 that facilitates executing received host commands, for example by setting up and executing remote DMA data transfers, and sending translated data storage device commands to respective data storage devices 120 for execution.

One or more host command queues 230, used to track commands received from hosts 110 and their associated translated commands;

Translation tables 240, used in some embodiments to translate addresses or name spaces in the received host commands into data storage device identifiers or data storage device addresses; and RDMA engines 250, used in some embodiments to transfer data between a host buffer and one or more allocated storage buffers 150 associated with one or more data storage devices 120. The RDMA engines 250 in some embodiments use translated commands, addresses and/or buffer pointers associated with translated commands to accomplish remote direct memory access (RDMA) operations; each RDMA engine 250, once configured with pointers to host and storage device buffers and a counter or other indicator of the quantity of data to be transferred, transfers data between designated host buffers and storage buffers 150 independently of the one or more processors 200.

In some embodiments, memory 206 of controller system 130 also includes one or more RDMA buffers 252, for temporarily storing data or information being transferred between a host and a data storage device, as discussed below.

Optionally, memory 206 of controller system 130 further includes stripe map engine 260 for determining the non-volatile data storage devices 120 in which to store data and parity information for any given write command or set of write commands, for example when using a particular Redundancy Coding level (e.g., any predefined RAID level such as RAID0 to RAID6, RAID10, RAID01, and so on). In some embodiments, stripe map engine 260 works in conjunction with a stripe map 262 or stripe function for determining the particular data storage devices in which to store data and parity when performing any specified write operation or set of write operations. In some embodiments, controller system 130, when sending a parity generation command to a particular data storage device 120, to generate parity data for specified data, also provides to that data storage device a stripe map or other data structure so that the data storage device knows which other data storage device to forward the specified data to for storage.

In some embodiments, memory 206 of memory controller 130 further includes a data recovery module 280, as part of the host command processing module 220, for recovering data when a data storage device fails or more generally when the data in a portion of a stripe cannot be read from the information stored in the data storage device(s) storing that portion of the stripe.

Each of the above identified elements may be stored in one or more of the previously mentioned memory devices that together form memory 206, and corresponds to a set of instructions and data for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing respective operations in the methods described below with reference to FIGS. 5A-5D.

Although FIG. 2 shows a controller system 130, FIG. 2 is intended more as a functional description of the various features which may be present in a controller system, or non-volatile memory controller, than as a structural schematic of the embodiments described herein. In practice, and as recognized by those of ordinary skill in the art, items shown separately could be combined and some items could be separated. Further, as noted above, in some embodiments, one or more modules of controller system 130 are implemented by one or more modules of host computer system 110.

In some embodiments, controller system 130 is implemented, at least in part, as a respective data storage device 120 (of the plurality of data storage devices in the storage system 102 or 162), to which has been added the host command processing module 220, host command queue 230, RDMA modules 250 and RDMA buffers 252, and other modules and data structures shown in FIG. 2 for processing host commands. In some of those embodiments, the respective data storage device 120 implementing controller system 130 is also a target for host read requests to read data from that data storage device and host write requests to write data to that data storage device.

Figure 4:
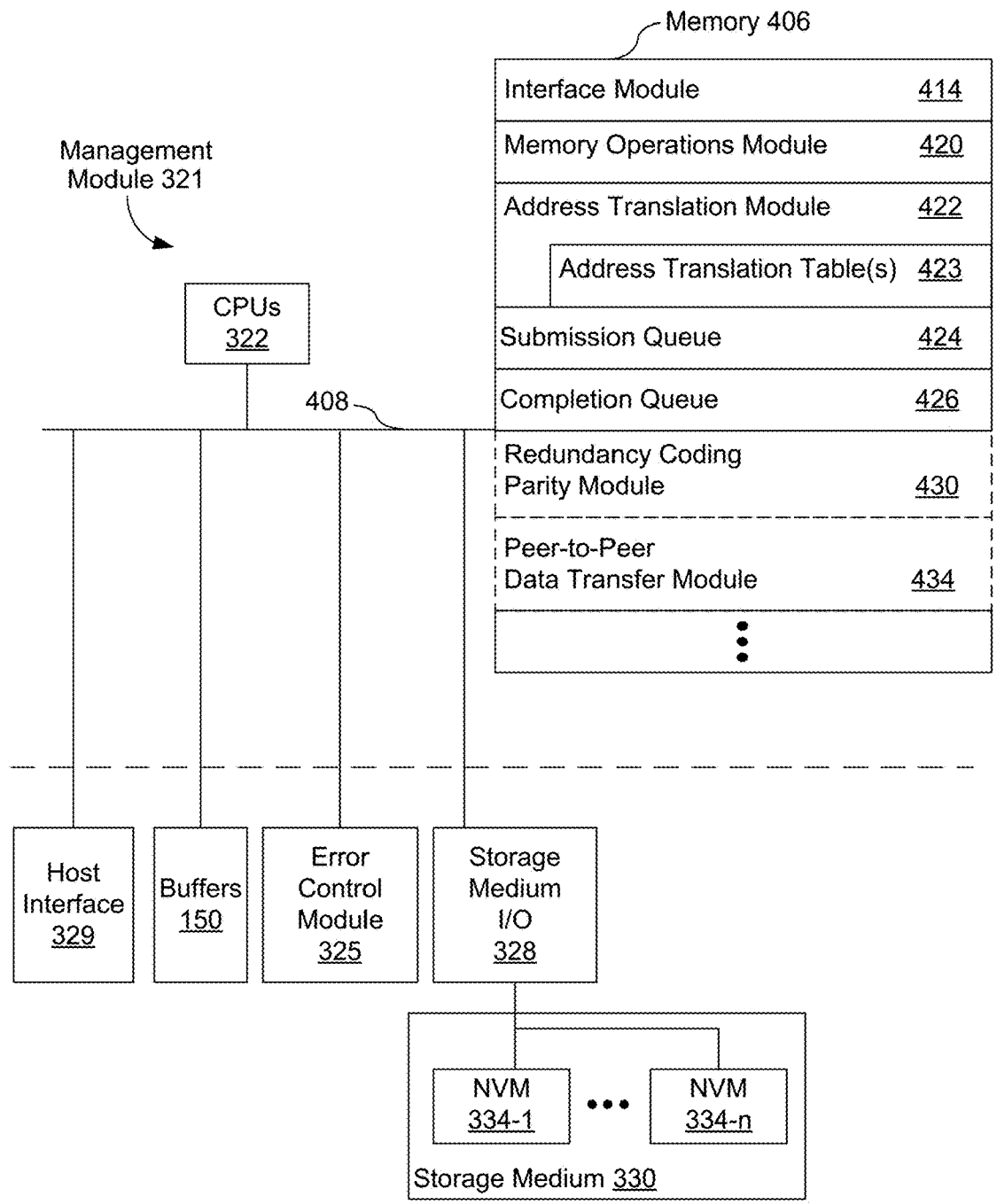
FIG. 4 depicts a block diagram of a memory management unit of a data storage device that is part of a non-volatile memory system, in accordance with some embodiments.

FIG. 4 depicts a block diagram of a management module 321, within a storage controller 324 of a data storage device 120 (e.g., a solid state drive) that is part of a non-volatile memory system 100 (FIG. 1A), in accordance with some embodiments. Thus, in some embodiments, each data storage device 120 of a non-volatile memory system 100 includes an instance of management module 321, while in some other embodiments, only some (e.g., one or more, or two or more, but less than all) of the data storage device 120 of non-volatile memory system 100 include an instance of management module 321.

Referring to FIG. 4, management module 321 includes one or more processing units 322 (further described above with reference to FIG. 3), coupled to memory 406, a host interface 329, buffers 150, error control module 325 and storage medium interface 328 over data connections 408. Additional elements may be included in the storage controller but are not shown here for brevity. Management module 321 controls access to the non-volatile media on its associated sold state drive.

Memory 406, sometimes called controller memory, includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 406 optionally includes one or more storage devices remotely located from processor(s) 322. Memory 406, or alternately the non-volatile memory device(s) within memory 406, comprises a non-transitory computer readable storage medium. In some embodiments, memory 406, or the computer readable storage medium of memory 406 stores the following programs, modules, and data structures, or a subset or superset thereof:

Interface module 414 used for communicating with controller system 130 via host interface 329, and optionally other components, such as non-volatile memory devices 334, via storage medium interface 328 and error control module 325.

A memory operations module 420 that executes read and write commands (sometimes herein called translated commands) received from controller system 130, and optionally allocates buffers 150 for receiving data to be stored in the data storage device and for receiving data read from the data storage device. In some other embodiments, controller system 130 allocates buffers 150. Execution of a respective write command includes writing data in one or more buffers 150 (allocated for storing the write data) into non-volatile storage medium 330. Execution of a respective read command includes reading data from non-volatile storage medium 330 to one or more buffers 150 allocated for execution of the read command. In some embodiments, each received read and write command is stored in a submission queue 424 until execution of the command by the data storage device is completed, after which it is moved to a completion queue 426. In some embodiments, after transfer of read data from buffers 150 to the requesting host system using RDMA, in the case of read commands, and after notification of execution completion in the case of write commands, the completed command is removed from completion queue.

In some embodiments, an Address Translation module 422 translates logical addresses in received (translated) commands into physical addresses in the physical address space of the data storage device, and updates one or more address translation tables 423 to keep track of the correspondence between logical and physical addresses. In some embodiments, address translation is performed by controller system 130 instead of the individual storage devices.

One or more submission queues 424 may be used to store status information regarding translated read and write commands received from hosts 110, the execution of which has not yet been completed; and One or more completion queues 426 may be used to store completion information regarding translated read and write commands received from hosts 110, the execution of which has been completed, which completion information may be propagated back to the hosts that sent the original commands.

Optionally, in some embodiments, memory 406, or the computer readable storage medium of memory 406 also stores a Redundancy Coding parity module 430, for computing and storing parity information in storage medium 330 of the data storage device 120 in which management module 321 resides.

Optionally, in some embodiments, memory 406, or the computer readable storage medium of memory 406 also stores a Peer-to-Peer Data Transfer module 434, for transferring data between the data storage device 120 in which management module 321 resides and other data storage devices, such as the other data storage devices 120 in non-volatile memory system 100 (see FIG. 1A) or 160 (see FIG. 1B). In various embodiments, peer-to-peer (sometimes herein referred to as 'P2P') communications between storage devices (e.g., SSDs) are implemented in various ways. For example, in some embodiments, P2P communications operate in full initiator mode, which enables a storage device to connect, to create commands, and to send the commands to other storage devices. In some other embodiments, a host system sets up shared memory areas in each data storage device, sends one or more commands to a source data storage device to read data in the source data storage device to a shared memory area, and then initiates the sending of data from the shared memory to a target storage device using DMA.

Figure 5A:
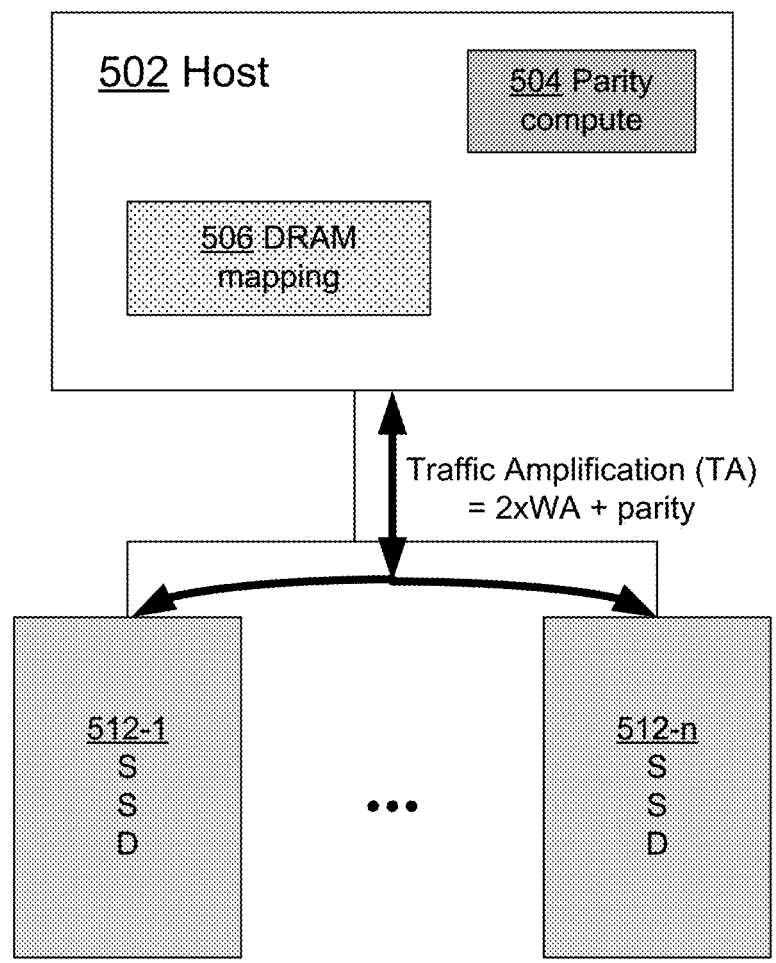
FIGS. 5A-5C illustrate methods of computing parity in network connected data storage systems in accordance with some embodiments.
Figure 5B:
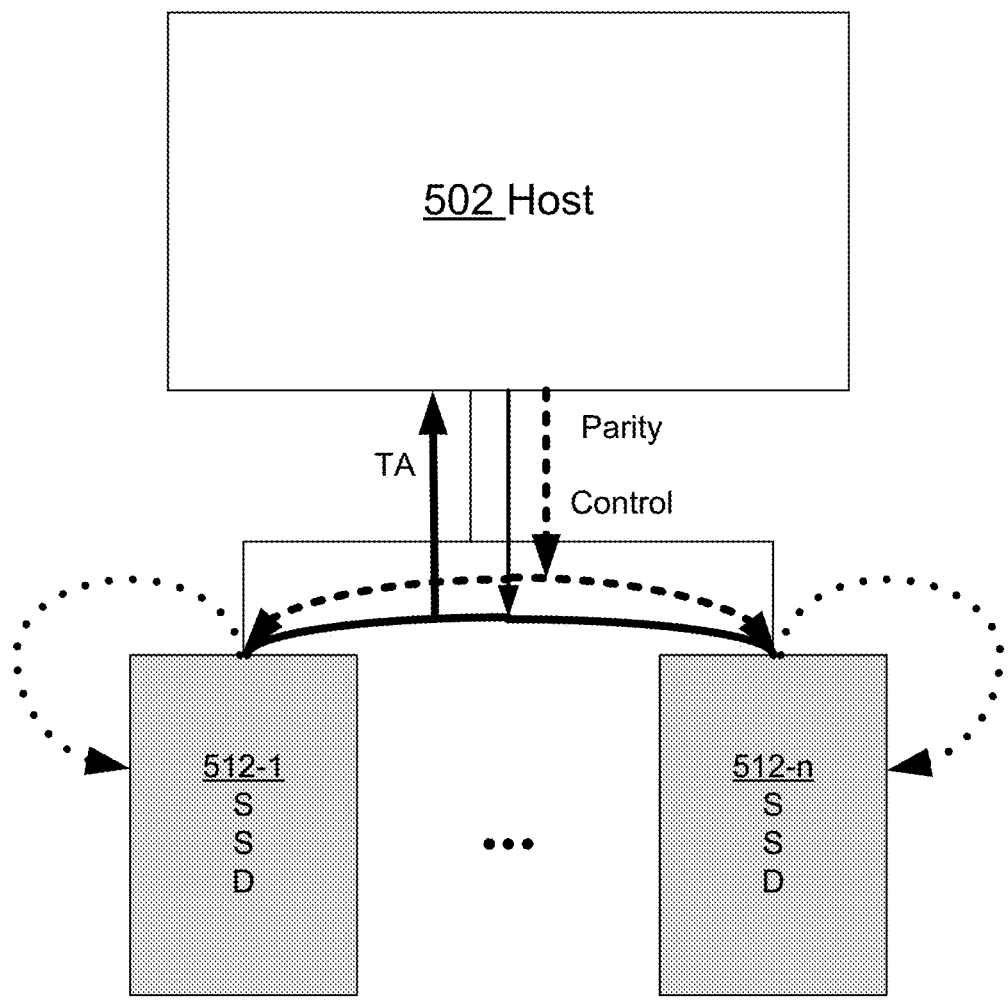
Figure 5C:
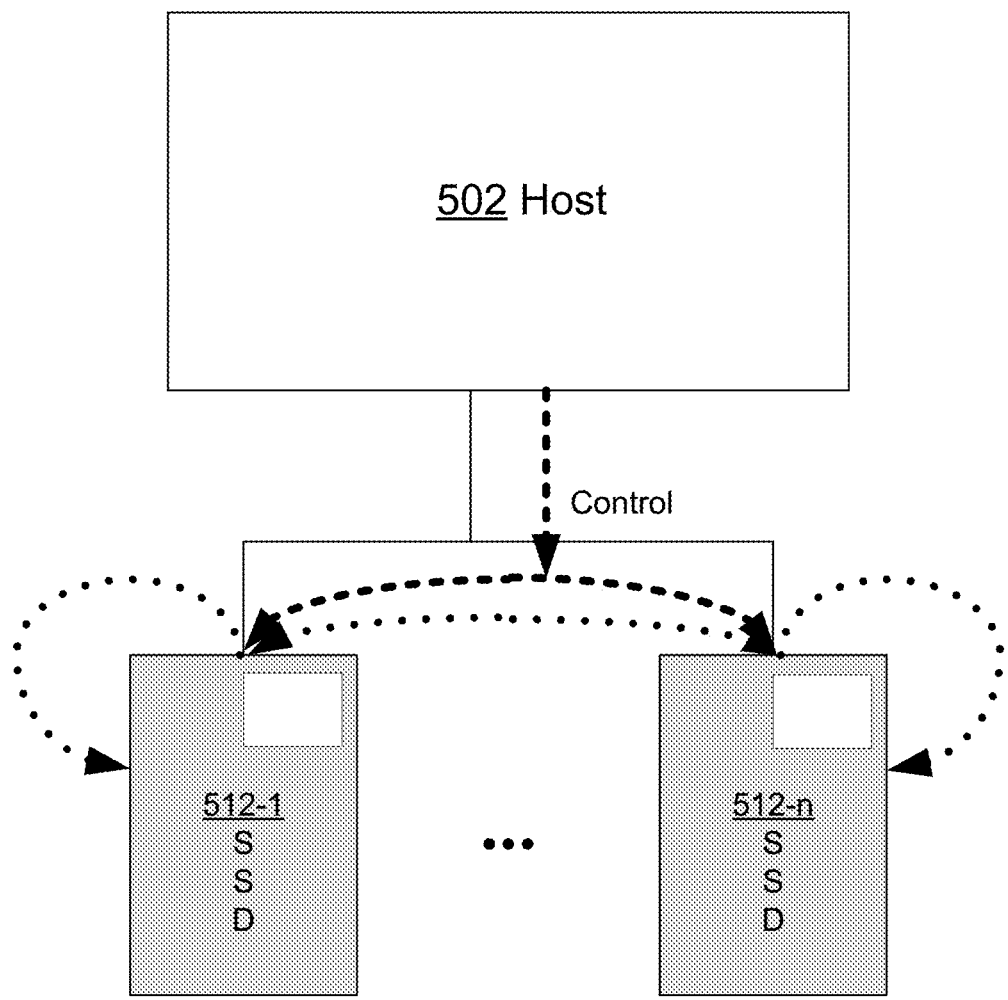

FIGS. 5A-5C illustrate methods of computing parity in network connected data storage systems in accordance with some embodiments. FIG. 5A illustrates a traditional approach according to some embodiments. In some embodiments, a host system (502), such as a CPU system, receives and buffers data in memory, such as in DRAM memory using DRAM mapping 506, while the data is routed between the network host 502 and non-volatile memory storage (e.g., any of SSDs 512-1 through 512-*n*, wherein n is an integer greater than 1, and is typically an integer greater than 2) for reading or writing data. The host 502 has a parity compute module (shown as module 504) that computes parity for the storage devices. Typical systems implement write serializing (log structured) type of flash storage organization. With this approach, it is possible to have better control over garbage collection processes in storage devices resulting in more predictable latency compared to systems without write serializing. The overall write amplification factor, i.e., the ratio of actual data written to the storage device versus data requested by the host to write to the device, is also reduced. Write serializing also helps with implementing performance-optimized RAID and other block or object erasure coding schemes while accumulating multiple small writes into full RAID stripes. Thus, this approach also eliminates costly read-modify write cycles for data and parity for sub-stripe writes.

A drawback of the traditional approach shown in FIG. 5A, however, is that it requires global garbage collection. For purposes of data compaction, this approach requires that data to be moved between storage devices (e.g., SSDs) over the host bus. For example, data is moved from a source SSD to the host and then to a destination SSD. Thus, this approach results in a "traffic amplification" factor of 2. Also, extra parity data has to be transferred between host and the storage devices. This is illustrated in FIG. 5A with the solid black lines and the label "Traffic Amplification=2xWA+ parity" (where WA means "write amplification"). In some cases, the write amplification factor could be as high as 4.5, and the extra host bus traffic increase caused by garbage collection can reach 10 times normal traffic (e.g., traffic amplification=2WA+parity, and thus for WA=4.5, TA=10). This is a huge penalty for network connected storage systems. Additionally, parity computations used in RAID or erasure coding redundancy schemes are expensive and can consume all the resources on a host system, including multiple CPU cores, and multiple memory channels, and can thrash the host system's CPU caches as well, thereby degrading overall host system performance.

Moreover, although inter-storage device buses (e.g., an internal inter-SSDs bus) in network connected storage systems (e.g., storage systems with independent disks, as well as storage systems with disks organized in accordance with any of the RAID levels) are typically bandwidth overprovisioned compared to an external bus, storage systems using the traditional approach shown in FIG. 5A fail to exploit that additional available bandwidth (e.g., to rebuild a failed drive faster). As an illustration, with 32 NVMe SSDs with four PCIe v3 lanes, overall internal bus capacity is 32×4×1 GB/s×2 (for full-duplex), which equals 256 GB/s. In case of network disaggregated storage systems with 4 external 100 Gb ports (80 GB/s overall in full duplex mode), this bandwidth overprovisioning is 3.2 times (256/80) normal available bandwidth. With PCIe v4, which is twice as fast as PCIe v3, this overprovisioning is twice as large, i.e., 6.4 times (512/80) normal available bandwidth. Storage systems using the traditional approach shown in FIG. 5A fail to make use of this bandwidth overprovisioning.

FIG. 5B illustrates offloading parity computation from host system 502 to storage devices 512-1 through 512-*n* according to some embodiments. In systems that implement this approach, although the data does not have to be transferred to the host for computing parity, the results of parity computations that are to be written to other storage devices than the storage device(s) performing the parity computation (e.g., in accordance with a predefined RAID or other Redundancy Coding scheme or system) still pass through the host. As shown in FIG. 5B, the host sends control commands (black line) and the parity compute command(s) (dashed lines) to one or more of the storage devices (512-1 through 512-*n*). Once parity is computed, storage devices can locally write data (as indicated by the dotted lines), but any inter-storage device data writes require host intervention (shown by the solid black line pointing to host system 502) and incurs traffic amplification (shown by the label 'TA').

FIG. 5C illustrates offloading parity computations from host system 502 to storage devices 512-1 through 512-*n* while also leveraging peer-to-peer (P2P) communications between storage devices, according to some embodiments. In such embodiments, the host sends parity compute (control) commands (shown by the dashed lines) to the storage devices, and does not participate in storage of the resulting parity data. The storage devices, in response to the parity compute commands, use peer-to-peer data transfer (shown by dotted lines) to move data corresponding to a data stripe to a parity data storage device that is designated to compute parity. In some embodiments, the parity storage device is chosen in a round-robin fashion or based on the data stripe from amongst the storage devices (e.g., devices 512-1 through 512-*n*) such that overall storage system performance is improved. For example, different storage devices may be selected or assigned to perform parity computation for different data stripes that are stored in the same set of storage devices. In some embodiments, a parity storage device computes parity and writes the parity data locally. Additionally, in some embodiments, when there is more than one storage device storing parity data, the parity storage device uses peer-to-peer data transfers (also shown by the dotted lines) to transfer parity data computed by the parity storage device to one or more other storage devices. These aspects and embodiments are discussed in further detail below.

Parity Computation Offload

In some embodiments, to facilitate parity generation and increase the rate of storage to a storage system incorporating data storage devices (e.g., storage system 100, FIG. 1A), controller system 130 (e.g., See FIG. 1A or 1B), while processing a data compaction command received from a host computer 110, offloads parity generation to one or more of the data storage devices 120 of the storage system 102 or 162, as described in more detail below. This is in contrast to systems in which parity is computed by the controller system 130 of the storage system 100 or 160, or by a host system 110.

Referring back to FIG. 2, the non-volatile storage devices 120-1 to 120-*m* in a non-volatile storage system 100 (FIG. 1A) or 160 (FIG. 1B) can be used to store data using redundant data-based protection schemes, sometimes called Redundancy Coding, one example of which is RAID (redundant array of independent disks). Numerous types or levels of Redundancy Coding and RAID are well known, and the present document does not presume to fully describe all types or levels of Redundancy Coding and RAID, nor to describe new levels or types of Redundancy Coding. Rather, this document presents new systems and methods for computing parity information for any such Redundancy Coding system, so as to improve system efficiency and scalability. In some embodiments, for a given Redundancy Coding or RAID system, storage locations in storage devices 120-1 to 120-M are divided into Redundancy Coding stripes, each having storage locations in a predefined number, D, of data storage devices, such as 6 or 8 or 10 or other number. D is generally an integer equal to 2 or more, and is typically 4 or more, and more typically is equal to 6 or more or 8 or more.

In some embodiments, the sets of data storage devices in which the storage locations are located for various Redundancy Coding stripes (within a single storage system 100 or 160) are overlapping. Stated another way, in many systems, the sets of data storage devices used to store Redundancy Coding Stripes A and B, or Redundancy Coding Stripes A1 to An, where n is an integer greater than 2, are overlapping. For example, a first Redundancy Coding stripe includes storage locations in data storage devices 120-1 to 120-$s$, a second Redundancy Coding stripe includes storage locations in data storage devices 120-2 to 120-$s$+1, a third Redundancy Coding stripe includes storage locations in data storage devices 120-3 to 120-$s$+2, and so on, where s is the number of data storage devices in each Redundancy Coding stripe.

In some Redundancy Coding levels or types, parity information is stored in just one data storage device for each Redundancy Coding stripe, whereas in some other Redundancy Coding levels or types, parity information is stored in two or more data storage devices for each Redundancy Coding stripe. For example, in FIG. 2A, each data storage device in which data is stored for a particular Redundancy Coding stripe is labelled "D", while each data storage device in which parity is stored is labelled "P". FIG. 2B schematically represents a storage system using a Redundancy Coding parity storage pattern of interest that includes both "local" and "global" parity values. In FIG. 2B, each data storage device in which data is stored for a particular Redundancy Coding stripe is labelled "D", each data storage device in which local parity is stored is labelled "LP", and the data storage device in which global parity is stored is labelled "GP". In systems of this latter type, herein called local/global Redundancy Coding systems, multiple Redundancy Coding sub-stripes 290 (e.g., sub-stripes 290-1 to 290-$m$) each have a local parity data storage device, labelled LP in FIG. 2B, (or, alternatively, two or more local parity data storage devices), and the set of multiple Redundancy Coding stripes also includes a global parity data storage device, labelled "GP" in FIG. 2B. The multiple Redundancy Coding sub-stripes 290 and the global parity data storage device together comprise a single Redundancy Coding stripe 292. When data is written to the Redundancy Coding stripe, both local parity and global values are generated. Parity generation and data recovery in local/global Redundancy Coding systems is discussed below. Since there are many Redundancy Coding levels or types and numerous variations in how those Redundancy Coding levels or types are implemented, further description of such Redundancy Coding levels and types is not provided herein, except as it may be relevant to the various embodiments of systems and methods for generating the parity information and storing data in systems that implement such Redundancy Coding levels or types.

As briefly described above with reference to FIG. 2, the controller system 130 of a storage system 100 or 160 may include a stripe map engine 260, which optionally includes or uses a stripe map 262, and more generally maps write data for any given write request to a Redundancy Coding stripe, which can be called the identified Redundancy Coding stripe. In some embodiments, stripe map engine 260 determines both a first data storage device within the identified Redundancy Coding stripe to which to write the data and a second data storage device within the identified Redundancy Coding stripe at which to compute parity data for data that includes the specified data to be written to the first data storage device.

The pattern or mapping method used to assign selected drives for parity generation may be static or dynamic. In some embodiments, the selected drive is randomly selected from among the available drives. In some embodiments, the selected drive is changed on a rotating basis with each successive write or at regular or irregular intervals. Thus, in some embodiments, multiple selected drives operate in parallel to generate parity in accordance with a parity offload arrangement. Multiple selected drives operate in parallel to generate parity and propagate parity and/or data to other drives based on the stripe map in some embodiments.

In some embodiments, the stripe map for each stripe includes location information for all "chunks" in the stripe, including data chunks and one or more parity chunks. Each chunk corresponds to the physical space used to store data or parity in a single data storage device in the stripe. A chunk is typically a set of one or more blocks located on a single drive. In some embodiments, the location information for each chunk can be of the form (SSD, LBA) for each chunk, where SSD identifies the data storage device in which the chunk is stored, and LBA is (or identifies) the logical block address mapped to the location at the beginning of the chunk. Thus, in such embodiments, the stripe map for each stripe is of the form (SSD1, LBA1), (SSD2, LBA2), (SSDc, LBAc), where c is the number of chunks in the stripe. The stripe map optionally includes a stripe identifier, but in some embodiments the stripe identifier is inferred from the location (e.g., the entry number) of the stripe map in a table of stripe maps. Other forms of stripe maps may be used. Typically, the stripe map for each stripe contains the information needed to locate all data and parity in the stripe. In some embodiments, each stripe map is dynamically generated when space for the stripe is allocated in the non-volatile memory system 100 (FIG. 1A).

As briefly described above with reference to FIG. 4, in some embodiments, each data storage device that participates in using Redundancy Coding storage for data protection includes a Redundancy Coding parity module 430 for generating and storing parity values. While in some embodiments only a subset of the data storage devices in the storage system (e.g., storage system 100 or 160) have such a module, because only a subset of the data storage devices are used to compute and store parity, more typically parity computation and storage is spread across all the data storage devices in the system that participate in Redundancy Coding storage for data protection, so as to spread the parity computation load as evenly as possibly across all data storage devices in the storage system.

Figure 6B:
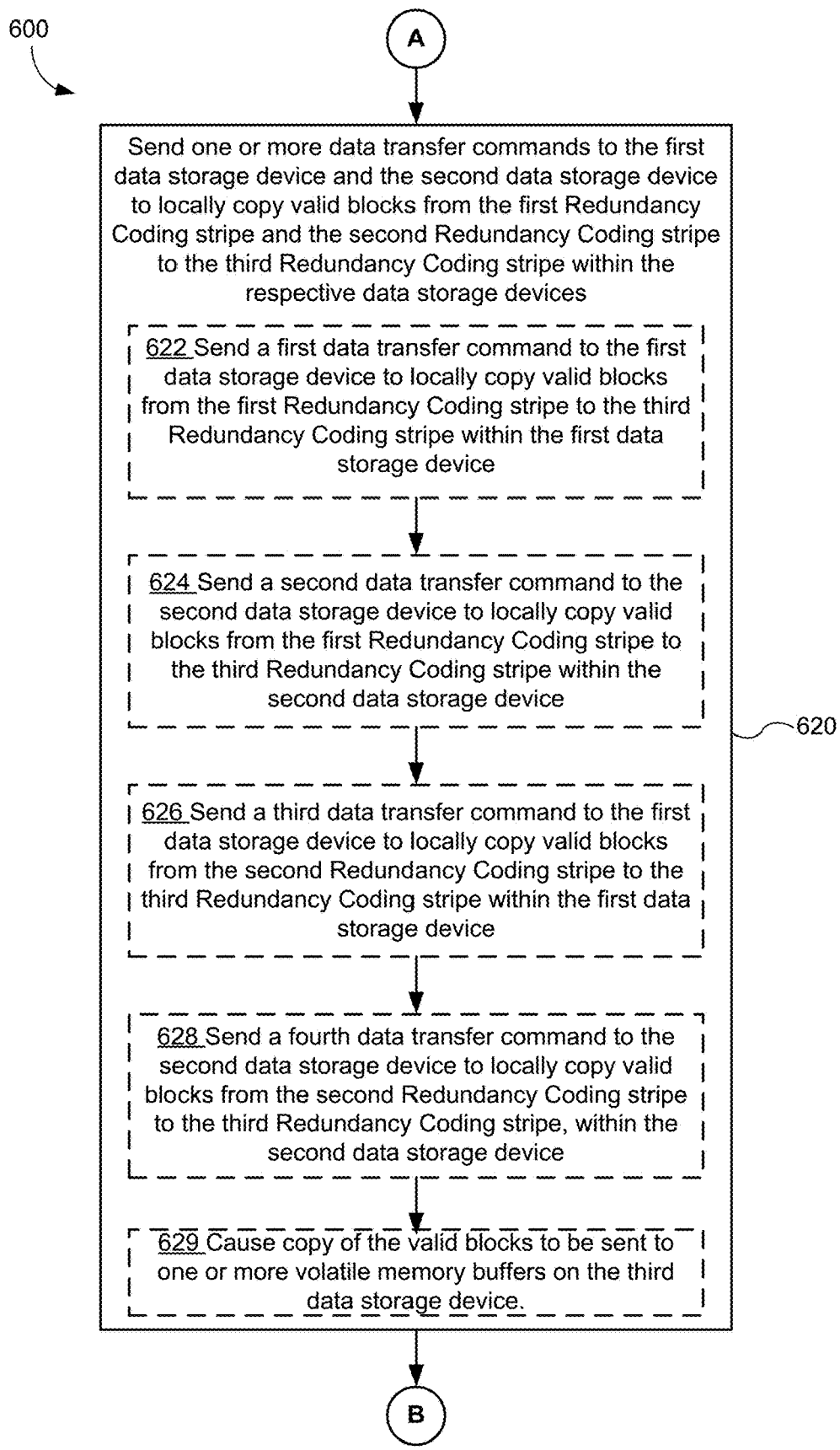
Figure 6C:
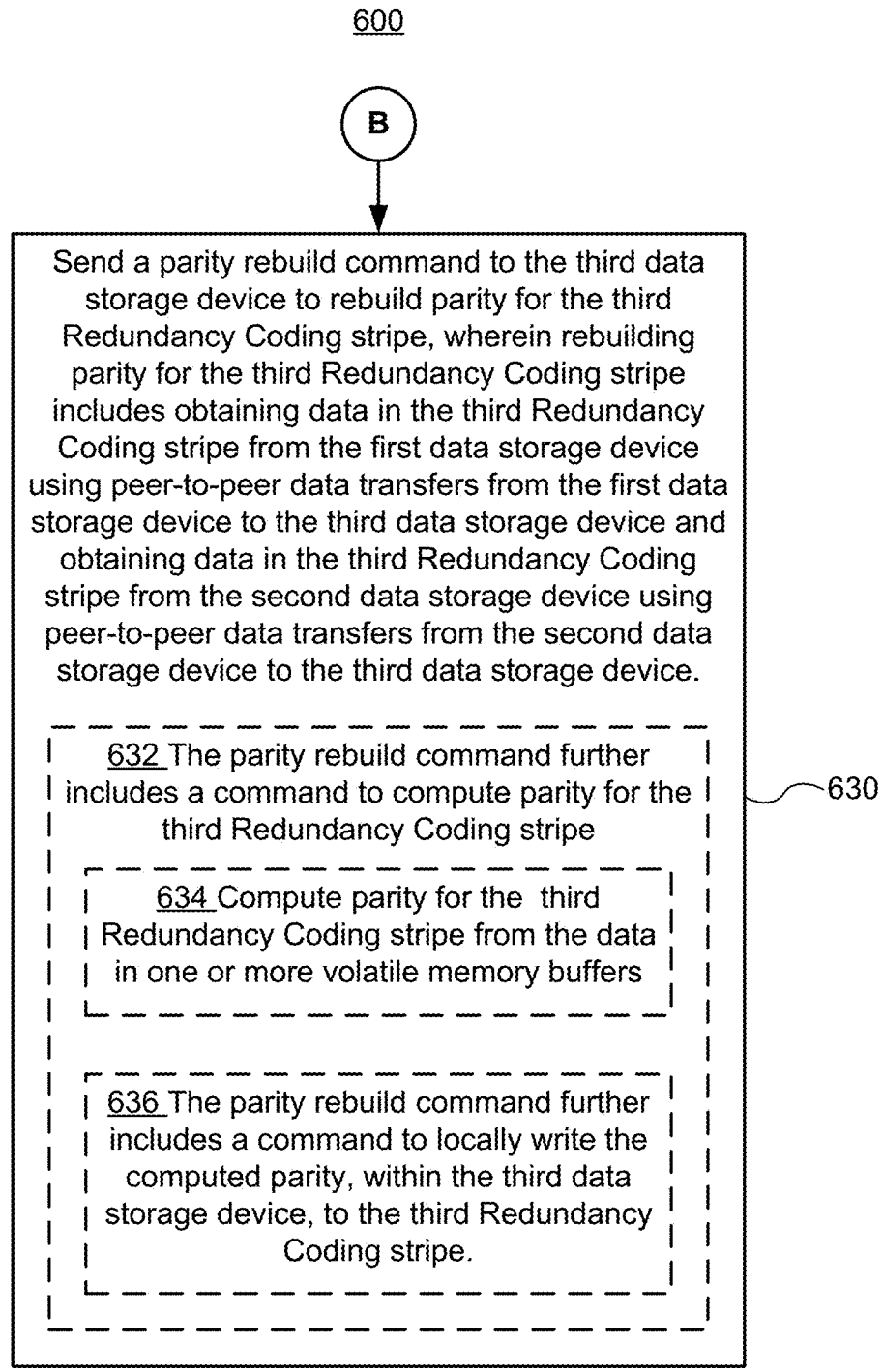

FIGS. 6A-6C illustrate a flowchart representation of a method of offloading parity generation to one or more data storage devices during data compaction using peer-to-peer data transfers, in accordance with some embodiments. As noted above, in some embodiments, to facilitate parity generation and increase the rate of storage to a storage system incorporating data storage devices (e.g., storage system 100, FIG. 1A), controller system 130 (e.g., See FIG. 1A or 1B), while processing a compaction request (e.g., received from a host computer 110), offloads parity generation for the write data to one or more of the data storage devices 120 of the storage system 102 or 162. This will now be described in more detail.

Method 600 is performed in a non-volatile memory system (e.g., NVM system 100, FIG. 1A) that includes controller system (e.g., controller system 130) and a plurality of data storage devices (e.g., data storage devices 120-1 to 120-$m$, where m is an integer greater than 2, is typically an integer equal to 4 or more, and more typically is an integer equal to 6 or more or 8 or more), such as those shown in FIG. 1A. In some embodiments, the controller system is a non-volatile memory express (NVMe) controller.

The method includes, at the controller system, receiving (602) a compaction request to compact a first Redundancy Coding stripe and a second Redundancy Coding stripe into a third Redundancy Coding stripe in the plurality of data storage devices. The first Redundancy Coding stripe, the second Redundancy Coding stripe and the third Redundancy Coding stripe include storage locations in a set of data storage devices comprising three or more of the plurality of data storage devices. As an example that we will use for further illustration of the flowcharts, a garbage collection process executed by a host can choose to compact stripes 10 and 101 into stripe 25, and the host sends to the controller system a compaction request with the information on the stripes. In some embodiments (606), the controller system receives the compaction request from a host system external to the non-volatile memory system. In some embodiments, a command processing module (e.g., host command processing module 220) of the controller system receives the compaction request from a host.

In some embodiments (604), the controller system is a host system external to the non-volatile memory system, and the compaction request is received from an application executed by the host system. In some such embodiments, the controller system is optionally configured to be coupled to one or more other host systems 110 (FIG. 1A). Alternatively, the controller system is (608) one or more modules (e.g., a controller, a CPU, or a Hardware Automation module) of a respective storage device of the plurality of data storage devices.

In response to receiving the compaction request, the controller system performs a sequence of operations (612) using a command processing module (e.g., host command processing module 220). The sequence of operations 612 includes identifying (614), using a mapping engine (e.g., stripe map engine 260), a first data storage device and a second data storage device in the set of data storage devices (e.g., storage devices 120) from which to read data for the first Redundancy Coding stripe and the second Redundancy Coding stripe. The sequence of operations 612 further includes identifying (616), using a mapping engine (e.g., stripe map engine 260), a third data storage device in the set of data storage devices at which to compute and store parity for the identified third Redundancy Coding stripe. The identified first data storage device, the second data storage device, and the third data storage device each include a controller (e.g., storage controller 324), non-volatile memory (e.g., storage medium 330, typically including a plurality of non-volatile memory devices, such as flash memory chips), and a data buffer (e.g., storage buffers 150). To continue the example above, in response to the data compaction request to compact stripes 10 and 101 into stripe 25, the controller system, using stripe map engine 260, identifies SSD0 as the first data storage device corresponding to stripe 10, SSD1 as the second data storage device corresponding to stripe 101, and SSD2 as the third data storage device (parity storage device for stripe 25).

The sequence of operations (612) also includes sending (620), using a communications module (e.g., communications module 210), one or more data transfer commands to the first data storage device and the second data storage device to locally copy valid blocks from the first Redundancy Coding stripe and the second Redundancy Coding stripe to the third Redundancy Coding stripe within the respective data storage devices. In some embodiments, sending (620) the one or more data transfer commands includes: sending (622) a first data transfer command to the first data storage device to locally copy valid blocks from the first Redundancy Coding stripe to the third Redundancy Coding stripe within the first data storage device; sending (624) a second data transfer command to the second data storage device to locally copy valid blocks from the first Redundancy Coding stripe to the third Redundancy Coding stripe within the second data storage device; sending (626) a third data transfer command to the first data storage device to locally copy valid blocks from the second Redundancy Coding stripe to the third Redundancy Coding stripe within the first data storage device; and sending (628) a fourth data transfer command to the second data storage device to locally copy valid blocks from the second Redundancy Coding stripe to the third Redundancy Coding stripe, within the second data storage device. In some embodiments, the one or more data transfer commands are implemented using XCOPY commands to locally copy valid blocks. To continue our example, in response to the compaction request to compact stripes 10 and 101 into stripe 25, the controller system, according to some embodiments: (1) sends an XCOPY command to SSD0 to locally copy valid blocks from stripe 10 into stripe 25; (2) sends an XCOPY command to SSD1 to locally copy valid blocks from stripe 10 into stripe 25; (3) sends an XCOPY command to SSD0 to locally copy valid blocks from stripe 101 into stripe 25; and (4) sends an XCOPY command to SSD1 command to locally copy valid blocks from stripe 101 into stripe 25.

In some embodiments, sending (620) the one or more data transfer commands further includes causing a copy of the valid blocks to be sent to one or more volatile memory buffers (e.g., storage buffers 150) on the third data storage device. For the running example, the controller system additionally commands SSD0 and SSD1 to copy the valid blocks to a RAM buffer on SSD2, the parity storage device for stripe 25.

The sequence of operations (612) also includes sending (630), using a communications module (e.g., communications module 210), a parity rebuild command to the third data storage device to rebuild parity, for the third Redundancy Coding stripe, wherein rebuilding parity for the third Redundancy Coding stripe includes obtaining data in the third Redundancy Coding stripe from the first data storage device using peer-to-peer data transfers (e.g., using peer-to-peer data transfer module 434) from the first data storage device to the third data storage device and obtaining data in the third Redundancy Coding stripe from the second data storage device using peer-to-peer data transfers from the second data storage device to the third data storage device. In some embodiments, the peer-to-peer data transfers are implemented in the data storage devices using techniques described above with reference to FIG. 4 (peer-to-peer data transfer module 434). In some embodiments, the parity rebuild command instructs (630) the third data storage device (or includes a command that instructs the third data storage device) to compute parity (632), using a parity computing module (e.g., Redundancy Coding Parity module 430), for the third Redundancy Coding stripe. For the running example, in these embodiments, the controller system sends a parity rebuild command to SSD2 that commands SSD2 to get data for stripe 25 from SSD0 and SSD1, compute parity, and write it locally in stripe 25.

In some embodiments, computing parity (632) includes computing parity (634) for the third Redundancy Coding stripe from the data in one or more volatile memory buffers (e.g., storage buffer 150) to which valid blocks of data were stored in step 629 as described above. In some embodiments, the parity rebuild command further instructs (632) the third data storage device (or further includes a command that instructs the third data storage device) to locally write the computed parity (636), within the third data storage device, to the third Redundancy Coding stripe. In some embodiments, the computed parity is written to the portion of the third Redundancy Coding stripe that is in the third data storage device. To continue our example, in these embodiments, the controller system sends a parity rebuild command to SSD2 that commands SSD2 to compute parity from data in the RAM buffers and write it locally in stripe 25.

Thus, parity generation is offloaded from the controller system to a data storage device, called the third data storage device in the above discussion of method 600 (FIGS. 6A-6C). As shown in FIGS. 3 and 4, in some embodiments, the data storage device, labelled "storage device 120" in FIG. 3, includes a management module 321 having one or more hardware processing units (CPUs 322) and a Redundancy Coding parity module 430 for generating parity values, and for storing those parity values in the data storage device.

Furthermore, in systems using Redundancy Coding parity schemes that include storing the parity values for a Redundancy Coding stripe in more than one storage device, Redundancy Coding parity module 430 of a respective data storage device (e.g., the third data storage device in method 600) optionally generates all the parity values to be stored, within the Redundancy Coding stripe, in two or more storage devices 120. Optionally, in some embodiments, the same parity values are stored, within the Redundancy Coding stripe, in two or more storage devices. In some such embodiments, a copy of the generated parity values is transmitted from a respective data storage device (e.g., a third data storage device) to another data storage device (e.g., a fourth data storage device) in the set of data storage devices, and the generated parity values are stored in storage locations in the identified Redundancy Coding stripe that are located in that other (e.g., fourth) data storage device.

Recovering and Reconstructing Data

After data is written to a non-volatile memory system, that same data, or portions of the data, may be read in response to read requests received from one or more host systems. In the huge majority of cases, when a read request is processed (e.g., by host command processing module 220 of controller system 130), the storage device(s) storing the requested data are identified by the controller system, and the controller system sends one or more read commands to the identified storage device(s), which causes the data to be read and returned to the requesting host system.

If the storage device identified as storing requested data is "not available," meaning that it is unable to return the requested data (e.g., because the storage device has failed, or the number of errors in the raw data read from the device is greater than the error correction power of the error correction information stored with the data), the controller system performs a data recovery operation, for example using data recovery module 280 (FIG. 2). The data recovery operation typically includes sending a read or data recovery command to a storage device in which parity information is stored for the stripe in which the requested data was stored. The read or data recovery command includes information identifying the stripe (e.g., Redundancy Coding stripe), and the location of the data to be recovered. That storage device then uses the parity information for the identified stripe to identify data to be read from other portions of the stripe and combined with the parity information (e.g., by XORing the parity information and identified data) so as to recover the unavailable data, and then return the recovered data to the requesting host device. In some embodiments, the recovered data is also stored to a new location in the non-volatile memory system, and mapping information for the stripe (e.g., including the stripe map for the stripe) is updated to reflect the new location of the recovered data.

In some embodiments, of systems (e.g., shown in FIG. 2B) that store both local parity and global parity information, the data recovery command is sent to and processed by the local parity SSD, identified by the controller system as the SSD having local parity information for (or corresponding to) the requested data. If the data recovery operation performed by the local parity SSD is successful, the recovered data is typically returned to the host device by the local parity SSD, acting on behalf of the SSD which failed to return the requested data. However, in some embodiments, if the data recovery operation performed by the local parity SSD is unsuccessful (e.g., because two or more blocks or chunks of the identified stripe have failed), the controller system sends another data recovery command to a global parity (GP) SSD, as shown in FIG. 2B. The global parity SSD then performs a data recovery operation, by identifying and reading data from all the mini-stripes other than the mini-stripe from which the data was unable to be read, and combining global parity information stored in the global parity SSD with the data read from the other mini-stripes (e.g., by XORing the global parity information and the data read from the other mini-stripes) so as to recover the unavailable data, and then return that data to the requesting host device. In some embodiments, the recovered data is also stored to a new location in the non-volatile memory system, and mapping information for the stripe (e.g., including the stripe map for the stripe) is updated to reflect the new location of the recovered data.

FIG. 7 illustrates a flowchart representation of a method 700 of processing a read request to read identified data from a failed data storage device using peer-to-peer data transfer, in accordance with some embodiments. In some such embodiments, method 700 is performed by a controller system and includes, at the controller system, receiving (710) a read request to read identified data (e.g., identified in the read request by a logical address, or a range of logical addresses) from a failed data storage device in a set of data storage devices comprising three or more of the plurality of data storage devices. In some embodiments, the controller system receives (714) the read request from a host system external to the non-volatile memory system. In some embodiments, a command processing module (e.g., host command processing module 220) of the controller system receives the read request from the host system.

In some embodiments (712), the controller system is a host system external to the non-volatile memory system, and the read request is received from an application executed by the host system. In some such embodiments, the controller system is optionally configured to be coupled to one or more other host systems 110 (FIG. 1A). Alternatively, the controller system is (716) one or more modules (e.g., a controller, a CPU, or a Hardware Automation module) of a respective storage device of the plurality of data storage devices.

In response to receiving the read request (710), the controller system performs a sequence of operations (720) using a data recovery module (e.g., data recovery module 280). The sequence of operations (720) includes identifying (722) (e.g., using a mapping engine, such as stripe map engine 260), a parity data storage device in the set of data storage devices that contains parity corresponding to the identified data. The sequence of operations (720) also includes sending a reconstruction request (724), corresponding to the read request (710), to a respective data storage device comprising the parity data storage device or a data storage device other than the failed data storage device in the plurality of data storage devices, to reconstruct the identified data, wherein the reconstruction request commands the respective data storage device to retrieve, via peer-to-peer read requests, from other data storage devices in the set of data storage devices, data from one or more data blocks, and to reconstruct the identified data based on the retrieved data, retrieved from the other data storage devices in the set of data storage devices, and parity data locally stored at the parity data storage device. In some embodiments, the data storage devices implement the peer-to-peer read requests (data transfers) using techniques described above with reference to FIG. 4 (peer-to-peer data transfer module 434). The sequence of operations (720) also includes receiving (726) (e.g., using a communications module, such as communications module 210), the identified data from the respective data storage device identified in step 722. Although not shown in FIG. 7, in some embodiments, the received identified data is then sent by the controller system to the host system from which the read request was received (see 710 and 714).

In some embodiments, the reconstruction request is sent to the parity data storage device, and that request commands the parity data storage device to retrieve, via peer-to-peer read requests, data from other data storage devices in the set of data storage devices (e.g., the set of data storage devices corresponding to, and storing data for, a Redundancy Coding stripe), and to reconstruct the identified data based on the retrieved data from the other data storage devices and parity data locally stored at the parity data storage device. In some such embodiments, the identified data is received by the controller system from the parity data storage device when the parity data storage device is used to reconstruct the identified data. It is noted that the reconstruction request can be sent to and processed by any data storage device storing any portion of a stripe of data being read from. A respective data storage device that receives the reconstruction request retrieves (or otherwise receives) data (e.g., via peer-to-peer read requests) from other data storage devices in the same Redundancy Coding stripe, and combines that with data available locally on the respective data storage device, to reconstruct the identified data.

As further illustration, consider an example when one or more SSD has failed, a situation that is sometimes referred to as a degraded mode. Reads "from the failed SSD" (i.e., read requests for data formerly stored on the failed SSD) are handled by reading corresponding data and parity from other SSDs in the same Redundancy Coding stripe as the requested data, and using that information to rebuild the requested data. Suppose there are three SSDs: SSD0, SSD1, and SSD2. And suppose further that SSD1 has failed, that SSD2 contains parity data, and a host system sends the controller system a request to read block 1105 from failed data storage device SSD1. The controller system sends a read command to parity storage device SSD2. SSD2 sends a peer-to-peer (P2P) request to SSD0 to read a block corresponding to block 1105 (e.g., a block in the same Redundancy Coding stripe as block 1105). SSD2 reads the corresponding parity block locally. Based on the read data from SSD0 and the parity block obtained locally, SSD2 reconstructs data for SSD1's block 1105 and returns it to the host via the controller system.

Rebuilding Contents of a Failed Data Storage Device

In some embodiments, when an entire SSD fails and that condition is detected by the controller system or otherwise determined to have occurred, a data reconstruction operation is performed, for example by data recovery module 280. Data recovery module 280 identifies all the stripes that include data or parity information in the failed SSD (e.g., assigned to storage locations in the failed SSD), identifies an SSD for each such stripe to perform the reconstruction of the lost data, and sends a data reconstruction command to the identified SSD for each such stripe. Typically, the workload for reconstruction is spread across multiple data storage devices, thereby reducing the amount of time it takes to reconstruct the entire failed SSD, and also reducing interruption of service to the host devices.

Figure 8:
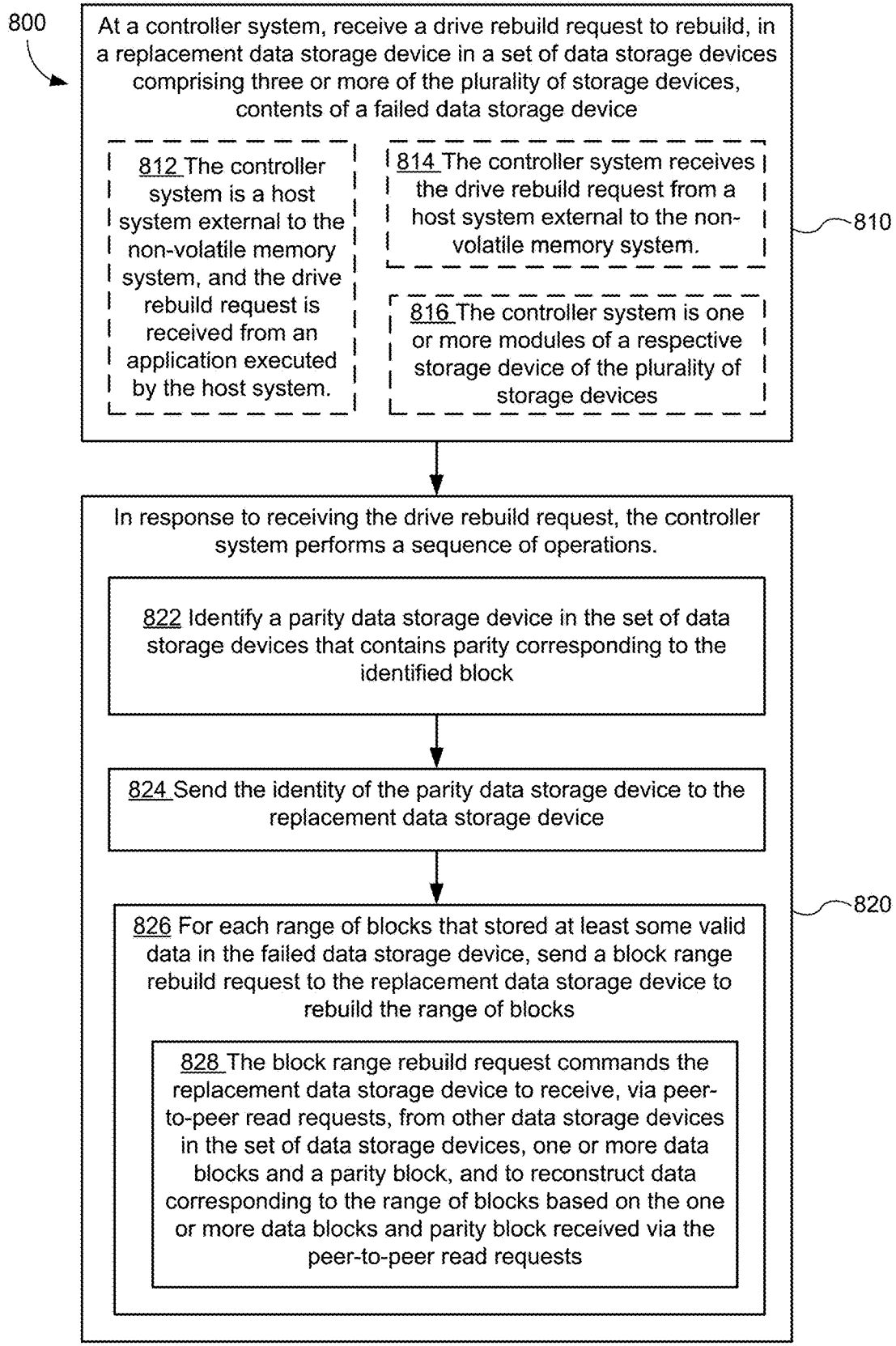
FIG. 8 illustrates a flowchart representation of a method of rebuilding, in a replacement data storage device, contents of a failed data storage device, using peer-to-peer data transfers, in accordance with some embodiments.

FIG. 8 illustrates a flowchart representation of a method 800 of rebuilding, in a replacement data storage device, contents of a failed data storage device, using peer-to-peer data transfers, in accordance with some embodiments. In some such embodiments, method 800 is performed by a controller system and includes, receiving (810) at the controller system a drive rebuild request to rebuild in a replacement data storage device, in a set of data storage devices comprising three or more of the plurality of data storage devices, contents of a failed data storage device. In some embodiments (814), the controller system receives the drive rebuild request from a host system external to the non-volatile memory system. In some embodiments, a command processing module (e.g., host command processing module 220) of the controller system receives the drive rebuild request from the host system.

In some embodiments (812), the controller system is a host system external to the non-volatile memory system, and the drive rebuild request is received from an application executed by the host system. In some such embodiments, the controller system is optionally configured to be coupled to one or more other host systems 110 (FIG. 1A). Alternatively, the controller system is (816) one or more modules (e.g., a controller, a CPU, or a Hardware Automation module) of a respective storage device of the plurality of data storage devices.

In response to receiving the drive rebuild request (810), the controller system performs a sequence of operations (820) using a data recovery module (e.g., data recovery module 280). The sequence of operations (820) includes identifying (822), using a mapping engine (e.g., stripe map engine 260), a parity data storage device in the set of data storage devices that contains parity corresponding to the identified block. The sequence of operations (820) also includes sending (824) the identity of the parity data storage device, using a communications module (e.g., communications module 210), to the replacement data storage device. The sequence of operations (820) also includes for each range of blocks that stored at least some valid data in the failed data storage device, sending (826) a block range rebuild request to the replacement data storage device to rebuild the range of blocks. In such embodiments, the block range rebuild request (826) commands (828) the replacement data storage device to receive, via peer-to-peer read requests (e.g., using peer-to-peer data transfer module 434), from other data storage devices in the set of data storage device, one or more data blocks and a parity block, and to reconstruct data corresponding to the range of blocks based on the one or more data blocks and parity block received via the peer-to-peer read requests.

As further illustration, consider an example where a SSD has failed and contents of the failed SSD must be rebuilt by reading data and parity from other SSDs. Suppose there are three SSDs: SSD0, SSD1, and SSD2. And suppose further that SSD1 has failed, SSD2 contains parity data, SSD1 has been replaced but needs to be rebuilt, and a host system sends the controller system a request to rebuild SSD1. The controller system sends a data rebuild command for a range of blocks (e.g., a range specified by the command, from block b0 to block b1) to storage device SSD1 (i.e., to the replacement device). SSD1 sends P2P read requests for blocks in a corresponding range to SSD0 (e.g., blocks in the corresponding range are data blocks in the same Redundancy Coding stripe as the blocks in the specified range), and P2P read requests for parity data blocks in a corresponding range to SSD2 (e.g., blocks in the corresponding range are parity data blocks in the same Redundancy Coding stripe as the blocks in the specified range). Based on the read data and parity blocks received from SSD0 and SSD2, SSD1 reconstructs local data in this range of blocks and writes them locally. The controller system continues the rebuilding process with successive ranges of blocks until all the contents of SSD1 are rebuilt.

Data Recovery Modes

Figure 9:
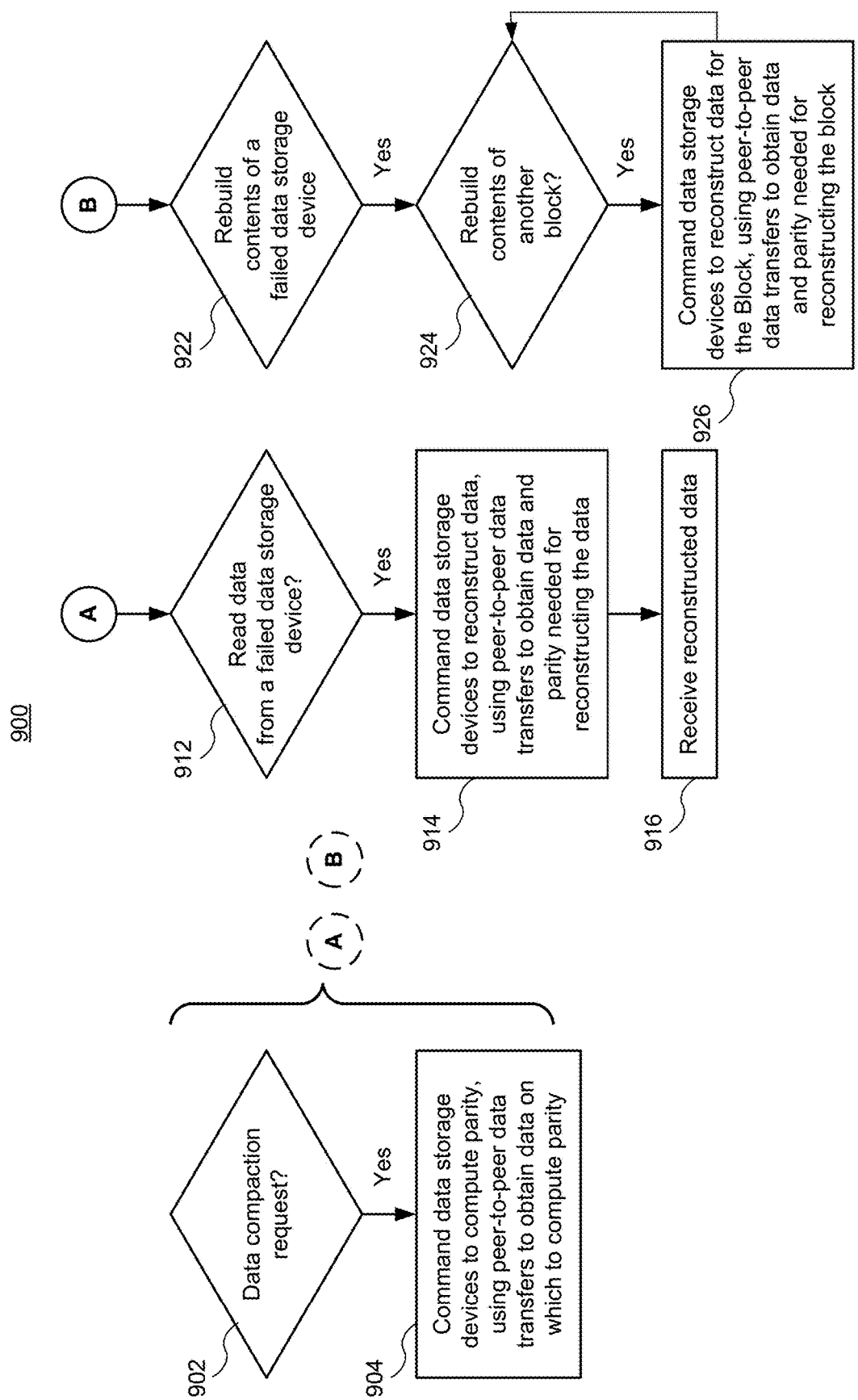
FIG. 9 illustrates various data recovery modes, according to some embodiments.

FIG. 9 illustrates various data recovery modes, according to some embodiments. In some embodiments, a controller system processes a data compaction request (902), as described above in detail with reference to FIGS. 6A-6C, by commanding (904) data storage devices to compute parity, using peer-to-peer data transfers to obtain the data needed to compute parity. As FIG. 9 indicates, even as the controller system is handling a compaction request, a data storage device in a plurality of data storage devices controlled by the controller system can fail. Consequently, in some embodiments, the controller system receives either a request to read data from the failed data storage device (indicated by 'A') and/or a request to rebuild contents of the failed data storage device (indicated by the 'B'). In some embodiments, as previously described, commands received from the host are queued in the host command queue 230. As described in detail above with reference to FIG. 7, to read data (912) from the failed storage device, the controller system commands (914) data storage devices to use reconstruct the requested data, using peer-to-peer data transfers to obtain the corresponding data and parity needed to reconstruct the requested data. The controller system receives (916) the reconstructed data from a data storage device that processes the reconstruction request on behalf of the controller system.

When a disk failure occurs and the failed storage device is replaced with a replacement storage device, in some embodiments, the controller system receives a rebuild request (922) to rebuild contents of a failed data storage device in a replacement storage device. As described above in detail with reference to FIG. 8, the controller system rebuilds contents of each block (924) of the failed data storage device until there are no more blocks to rebuild, by commanding (926) data storage devices to reconstruct data for each such block, use peer-to-peer data transfers to obtain the corresponding data and parity data needed to reconstruct the block. In some embodiments, there is overlap between steps 914 (used to handle a data read request) and 926 (drive rebuild request). For example, data recovery module 280 can invoke 914, repeatedly, for one or more data blocks, in the failed data storage device, to accomplish step 926 for rebuilding contents of the failed data storage device. In some other embodiments, the two paths (for reading data from a failed data storage device and rebuilding contents of a failed data storage device) may be implemented exclusively, using distinct sets of programs or executable instructions.

The embodiments of systems and methods described above leverage the availability of overprovisioned bandwidth, thereby speeding up parity computation and storage operations, recovery from data losses, and rebuilding failed data storage devices. In these systems and methods, the host is relieved from parity computations, freeing its resources for compute tasks, thus increasing overall system performance. Since the storage devices themselves take on tasks that were once done by a host system, the work associated with parity computations and recovery of lost data is distributed, and system performance scales with the number of storage devices.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of managing data storage in a non-volatile memory system comprising a plurality of data storage devices, the method comprising:
   at a controller system, receiving a read request to read identified data from a failed data storage device in a set of data storage devices comprising three or more of the plurality of data storage devices; and
   in response to receiving the read request, the controller system performing a sequence of operations, including:

identifying a parity data storage device in the set of data storage devices that generated and contains parity corresponding to the identified data;

sending a reconstruction request, corresponding to the read request, to a respective data storage device comprising the parity data storage device to reconstruct the identified data, wherein the reconstruction request commands the respective data storage device to retrieve, via peer-to-peer read requests, from other data storage devices in the set of data storage devices, data from one or more data blocks, and to reconstruct the identified data based on the retrieved data from the one or more data blocks and parity data locally stored at the parity data storage device; and receiving the identified data from the respective data storage device.

2. The method of claim 1, wherein:
the controller system is a host system external to the non-volatile memory system, and
the read request is received from an application executed by the host system.

3. The method of claim 1, wherein the controller system receives the read request from a host system external to the non-volatile memory system.

4. The method of claim 1, wherein each data storage device of the plurality of data storage devices includes: non-volatile memory for durably storing information, one or more data buffers for temporarily storing information being written to or read from the non-volatile memory of the data storage device, and a controller for controlling operation of the data storage device, including execution of compaction commands.

5. The method of claim 4, wherein: the non-volatile memory of each data storage device of the plurality of data storage devices comprises flash memory, and the one or more data buffers of each data storage device of the plurality of data storage devices comprises non-volatile RAM.

6. A memory controller, comprising:
a storage interface for coupling the memory controller to a plurality of data storage devices;
a communication interface for receiving read requests, each read request comprising a request to read identified data from a failed data storage device in a set of data storage devices comprising three or more of the plurality of data storage devices; and
a command processing module for processing a respective read request by performing a sequence of operations, including:
identifying a parity data storage device in the set of data storage devices that generated and contains parity corresponding to the identified data;
sending a reconstruction request, corresponding to the read request, to a respective data storage device comprising the parity data storage device to reconstruct the identified data, wherein the reconstruction request commands the respective data storage device to retrieve, via peer-to-peer read requests, from other data storage devices in the set of data storage devices, data from one or more data blocks, and to reconstruct the identified data based on the retrieved data from the one or more data blocks and parity data locally stored at the parity data storage device; and
receiving the identified data from the respective data storage device.

7. The memory controller of claim 6, wherein each data storage device of the plurality of data storage devices includes:

non-volatile memory for durably storing information,
one or more data buffers for temporarily storing information being written to or read from the non-volatile memory of the data storage device, and
a controller for controlling operation of the data storage device, including execution of compaction commands.

8. The memory controller of claim 6, wherein:
the non-volatile memory of each data storage device of the plurality of data storage devices comprises flash memory, and
the one or more data buffers of each data storage device of the plurality of data storage devices comprises non-volatile RAM.

9. The memory controller of claim 6, wherein:
the memory controller is a host system external to a non-volatile memory system comprising the plurality of data storage devices, and
a respective read request is received from an application executed by the host system.

10. The memory controller of claim 6, wherein the memory controller receives the read request from a host system external to a non-volatile memory system comprising the plurality of data storage devices.

11. A non-transitory computer readable storage medium storing one or more programs configured for execution by a memory controller configured to be coupled to a plurality of data storage devices, the one or more programs comprising instructions that when executed by one or more processors of the memory controller, cause the memory controller to:
receive read requests, each read request comprising a request to read identified data from a failed data storage device in a set of data storage devices comprising three or more of the plurality of data storage devices; and
process a respective read request by performing a sequence of operations, including:
identifying a parity data storage device in the set of data storage devices that generated and contains parity corresponding to the identified data;
sending a reconstruction request, corresponding to the read request, to a respective data storage device comprising the parity data storage device to reconstruct the identified data, wherein the reconstruction request commands the respective data storage device to retrieve, via peer-to-peer read requests, from other data storage devices in the set of data storage devices, data from one or more data blocks, and to reconstruct the identified data based on the retrieved data from the one or more data blocks and parity data locally stored at the parity data storage device; and
receiving the identified data from the respective data storage device.

12. The non-transitory computer readable storage medium of claim 11 wherein the memory controller is further caused to receive the read request from a host system external to a non-volatile memory system comprising the plurality of data storage devices.

13. The non-transitory computer readable storage medium of claim 11 wherein each data storage device of the plurality of data storage devices includes: non-volatile memory for durably storing information, one or more data buffers for temporarily storing information being written to or read from the non-volatile memory of the data storage device, and a controller for controlling operation of the data storage device, including execution of compaction commands.

14. The non-transitory computer readable storage medium of claim 13 wherein: the non-volatile memory of each data storage device of the plurality of data storage devices comprises flash memory, and the one or more data buffers of each data storage device of the plurality of data storage devices comprises non-volatile RAM.

15. The non-transitory computer readable storage medium of claim 11 wherein: the memory controller is a host system external to the plurality of data storage devices, and the read request is received from an application executed by the host system.

16. A memory controller, comprising:
 a storage interface for coupling the memory controller to a plurality of data storage devices;
 a communication interface for receiving drive rebuild requests, each drive rebuild request comprising a request to rebuild, in a replacement data storage device in a set of data storage devices comprising three or more of the plurality of data storage devices, contents of a failed data storage device; and
 a command processing module for processing a respective drive rebuild request, the command processing module including:
  identifying, means for identifying a parity data storage device in the set of data storage devices that generated and contains parity corresponding to the replaced data storage device;
  sending means for sending the identity of the parity data storage device to the replacement data storage device; and
  for each range of blocks that stored at least some valid data in the failed data storage device, sending means for sending a block range rebuild request to the replacement data storage device to rebuild the range of blocks;
  wherein the block range rebuild request commands the replacement data storage device to receive, via peer-to-peer read requests, from other data storage devices in the set of data storage device, one or more data blocks and a parity block, and to reconstruct data corresponding to the range of blocks based on the one or more data blocks and parity block received via the peer-to-peer read requests.

17. The memory controller of claim 16, wherein each data storage device of the plurality of data storage devices includes:
 non-volatile memory for durably storing information,
 one or more data buffers for temporarily storing information being written to or read from the non-volatile memory of the data storage device, and
 a controller for controlling operation of the data storage device, including execution of compaction commands.

18. The memory controller of claim 16, wherein:
 the non-volatile memory of each data storage device of the plurality of data storage devices comprises flash memory, and
 the one or more data buffers of each data storage device of the plurality of data storage devices comprises non-volatile RAM.

19. The memory controller of claim 16, wherein:
 the memory controller is a host system external to a non-volatile memory system comprising the plurality of data storage devices, and
 the drive rebuild request is received from an application executed by the host system.

20. The memory controller of claim 16, wherein the memory controller receives the drive rebuild request from a host system external to a non-volatile memory system comprising the plurality of data storage devices.

\* \* \* \* \*